US010809626B2

(12) United States Patent
Hyde, IV et al.

(10) Patent No.: US 10,809,626 B2
(45) Date of Patent: Oct. 20, 2020

(54) GENERATION OF VECTOR PARTIALLY COHERENT OPTICAL SOURCES USING PHASE-ONLY SPATIAL LIGHT MODULATORS

(71) Applicant: Government of the United States, as represented by the Secretary of the Air Force, Wright-Patterson AFB, OH (US)

(72) Inventors: Milo W. Hyde, IV, Alexandria, VA (US); Santasri R. Bose-Pillai, Beavercreek, OH (US)

(73) Assignee: The United States of America as represented by the secretary of the Air Force, Washington, DC (US)

(*) Notice: Subject to any disclaimer, the term of this patent is extended or adjusted under 35 U.S.C. 154(b) by 210 days.

(21) Appl. No.: 16/156,656

(22) Filed: Oct. 10, 2018

(65) Prior Publication Data
US 2019/0129312 A1    May 2, 2019

Related U.S. Application Data

(60) Provisional application No. 62/577,430, filed on Oct. 26, 2017, provisional application No. 62/740,105, filed on Oct. 2, 2018.

(51) Int. Cl.
*G03F 7/20* (2006.01)
*G02B 27/28* (2006.01)
*G01N 21/21* (2006.01)

(52) U.S. Cl.
CPC ......... *G03F 7/70408* (2013.01); *G01N 21/21* (2013.01); *G02B 27/286* (2013.01)

(58) Field of Classification Search
None
See application file for complete search history.

(56) References Cited

U.S. PATENT DOCUMENTS 6,252,665 B1 * 6/2001 Williams ............... G03F 7/001
356/450
7,599,069 B2 * 10/2009 Toussaint, Jr. ....... G02B 27/286
353/20

(Continued)

OTHER PUBLICATIONS

Gridley, Matthew J., et al. "Experimental method of generating electromagnetic Gaussian Schell-model beams." Unconventional Imaging and Wavefront Sensing 2015. vol. 9617. International Society for Optics and Photonics, 2015. (Year: 2015).*

(Continued)

*Primary Examiner* — Shawn Decenzo
(74) *Attorney, Agent, or Firm* — AFMCLO/JAZ; David Franklin

(57) ABSTRACT

A vector partially coherent source (VPCS) generator includes a laser that emits coherent light; an interferometer consisting of polarizing beam splitters (PBSs) to split the laser light into its vertical and horizontal polarization components;] first and second spatial light modulators (SLMs) that respectively control the vertical and horizontal polarization components; and a control system communicatively coupled to the first and second SLMs to adjust beam shape and coherence without physically moving or removing optical elements in the interferometer.

17 Claims, 22 Drawing Sheets

(56) References Cited

U.S. PATENT DOCUMENTS

| | | | |
|---|---|---|---|
| 2001/0021487 A1* | 9/2001 | Williams | G03F 7/001 430/323 |
| 2006/0109476 A1* | 5/2006 | Werner | G01B 9/02035 356/477 |
| 2015/0109597 A1* | 4/2015 | Schmitt | G02B 5/3083 355/71 |

OTHER PUBLICATIONS

"Experimentally generating any desired partially coherent Schell-model source using phase-only control", Milo W. Hyde IV, Santasri Basu, David G. Voelz, and Xifeng Xiao, Citation: Journal of Applied Physics 118, 093102 (2015); doi: 10.1063/1.4929811, View online: https://doi.org/10.1063/1.4929811, View Table of Contents: http://aip.scitation.org/toc/jap/118/9, Published by the American Institute of Physics.

"A method of generating electromagnetic Gaussian Schell-model beams", Tomohiro Shirai, Olga Korotkova and Emil Wolf, Published Mar. 30, 2005 • IOP Publishing Ltd, Journal of Optics A: Pure and Applied Optics, vol. 7, No. 5.

J Gridley, Matthew & Hyde, Milo & F Spencer, Mark & Bose-Pillai, Santasri. (2015). Experimental method of generating electromagnetic Gaussian Schell-model beams. 10.1117/12.2192049. https://www.researchgate.net/publication/281589975_Experimental_method_of_generating_electromagnetic_Gaussian_Schell-model_beams accessed Oct. 3, 2018.

"Using Phase Screens to Synthesize Electromagnetic Gaussian-Schell Model Sources With Desired Amplitude, Coherence, and Polarization" Thesis, Christopher J. Kokoczka, Capt, USAF, AFIT-ENG-MS-16-M-026, Department of the Air Force, Air University, Air Force Institute of Technology, Wright-Patterson Air Force Base, Ohio. http://www.dtic.mil/dtic/tr/fulltext/u2/1053826.pdf accessed Oct. 3, 2018.

Santasri Basu, Milo W. Hyde, Xifeng Xiao, David G. Voelz, and Olga Korotkova, "Computational approaches for generating electromagnetic Gaussian Schell-model sources," Opt. Express 22, 31691-31707 (2014). https://www.osapublishing.org/oe/abstract.cfm?uri=oe-22-26-31691 accessed Oct. 3, 2018.

Hyde, Milo & Bose-Pillai, Santasri & Voelz, David & Xiao, Xifeng. (2016). Generation of Vector Partially Coherent Optical Sources Using Phase-Only Spatial Light Modulators. Physical Review Applied. 6. 10.1103/PhysRevApplied.6.064030.

* cited by examiner

GENERATION OF VECTOR PARTIALLY COHERENT OPTICAL SOURCES USING PHASE-ONLY SPATIAL LIGHT MODULATORS

CROSS-REFERENCE TO RELATED APPLICATIONS

This application claims the benefit of priority under 35 U.S.C. § 119(e) to U.S. Provisional Application Ser. No. 62/577,430 entitled "Generation of Vector Partially Coherent Optical Sources Using Phase-Only Spatial Light Modulators", filed 26 Oct. 2017, and claims the benefit of priority under 35 U.S.C. § 119(e) to U.S. Provisional Application Ser. No. 62/740,105 entitled "Generation of Vector Partially Optical Sources Using Phase-Only Spatial Light Modulators", filed 2 Oct. 2018, the contents of both of which are incorporated herein by reference in their entirety.

ORIGIN OF THE INVENTION

The invention described herein was made by employees of the United States Government and may be manufactured and used by or for the Government of the United States of America for governmental purposes without the payment of any royalties thereon or therefore.

BACKGROUND OF THE INVENTION

The present disclosure generally relates to methods for generating polarized light and, more particularly, to techniques for beam shaping and adjusting coherence of vector (polarized) partially coherent optical sources.

Motivated by Wolf's seminal work on coherence and polarization [1,2], research involving vector or electromagnetic partially coherent sources has become quite popular [3-6]. Their widespread appeal stems from the fact that by just manipulating spatial coherence, the source's resulting shape and polarization can be precisely controlled. Numerous researchers have designed novel vector partially coherent sources (VPCSs) for applications such as free-space/underwater optical communications [7-16], remote sensing [17, 18], optical scattering [19-29], and particle manipulation/trapping [30-33].

The most straightforward and therefore popular VPCS generator design uses a Mach-Zehnder interferometer (MZI) consisting of polarizing beam splitters (PBSs) to split light from a common source into its vertical and horizontal polarization components [5, 6, 11, 34-39]. In each leg of the MZI, the amplitude (beam shape) and coherence of each field component are controlled using absorbing (amplitude) filters and ground glass diffusers [6, 30-33, 35, 36, 40, 41] or spatial light modulators (SLMs) [5, 11, 34, 37, 38, 42, 43], respectively.

While intuitive, the use of separate optical components to control beam shape and coherence complicates the optical set-up (alignment, system footprint/size, et cetera) and limits the types of VPCSs that can be generated (the system's flexibility). In particular, designs that rely on ground glass diffusers to affect coherence are generally limited to producing Schell-model sources [2, 5, 44, 45]. The most limiting aspect of existing designs is the use of amplitude filters to control beam shape. Amplitude filters adversely affect the flexibility of the system, considering that every new source requires a new set of filters.

BRIEF SUMMARY

In one aspect, the present disclosure provides a VPCS generator that includes a laser that emits coherent light; an interferometer consisting of PBSs to split the laser light into its vertical and horizontal polarization components; first and second SLMs that respectively control the vertical and horizontal polarization components; and a control system communicatively coupled to the first and second SLMs to adjust beam shape and coherence without physically moving or removing optical elements in the apparatus.

In another aspect, the present disclosure provides a method that includes a laser that emits coherent light that is received by an interferometer consisting of PBSs that split the laser light into its vertical and horizontal polarization components. The method includes dynamically controlling at least one of two SLMs that (i) selectively reflect or (ii) selectively transmit either the vertical or horizontal polarization component to control beam shape and coherence without physically moving or removing optical elements in the apparatus.

In an additional aspect, the present disclosure provides a VPCS generator that includes a laser that emits coherent light; a phase means for converting the coherent laser light into 45° polarized light; a means for splitting the 45° polarized light into its vertical and horizontal polarization components; first and second SLMs that respectively control the vertical and horizontal polarization components; and a control system communicatively coupled to the first and second SLMs to adjust beam shape and coherence without physically moving or removing optical elements in the apparatus.

The above summary contains simplifications, generalizations, and omissions of detail, and is not intended as a comprehensive description of the claimed subject matter but, rather, is intended to provide a brief overview of some of the functionality associated therewith. Other systems, methods, functionality, features, and advantages of the claimed subject matter will be or will become apparent to one with skill in the art upon examination of the following figures and detailed written description.

BRIEF DESCRIPTIONS OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

Figure 4A:
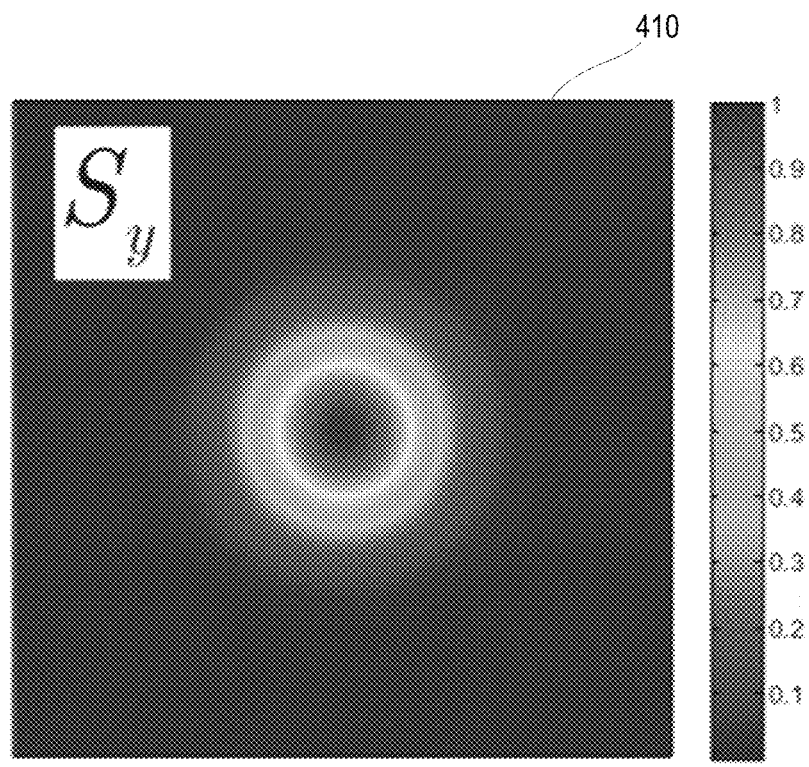
FIG. 4A is a two-dimensional graph illustrating spectral density $S_y$, beginning a screen synthesis process for producing a single instance of the y (vertical) component $E_y$ of an electromagnetic multi-Gaussian Schell-model (EMGSM) source.
Figure 4B:
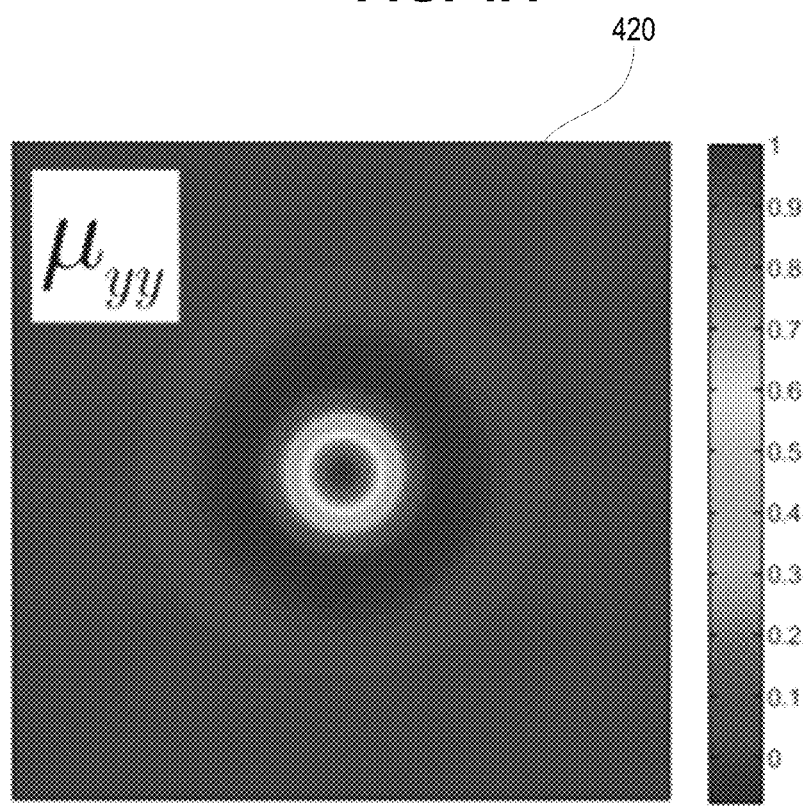
FIG. 4B is a two-dimensional graph illustrating correlation function $\mu_{yy}$ of the source.
Figure 4C:
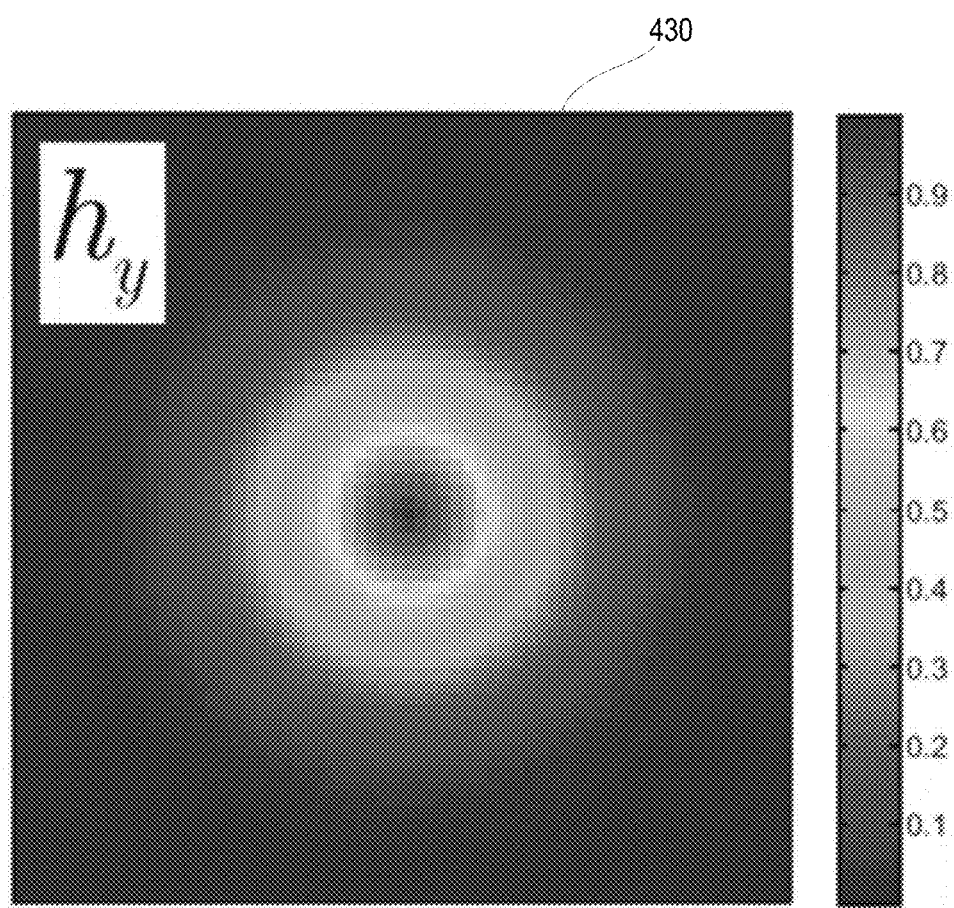
FIG. 4C is a two-dimensional graph illustrating the grating heights $h_y$.
Figure 4D:
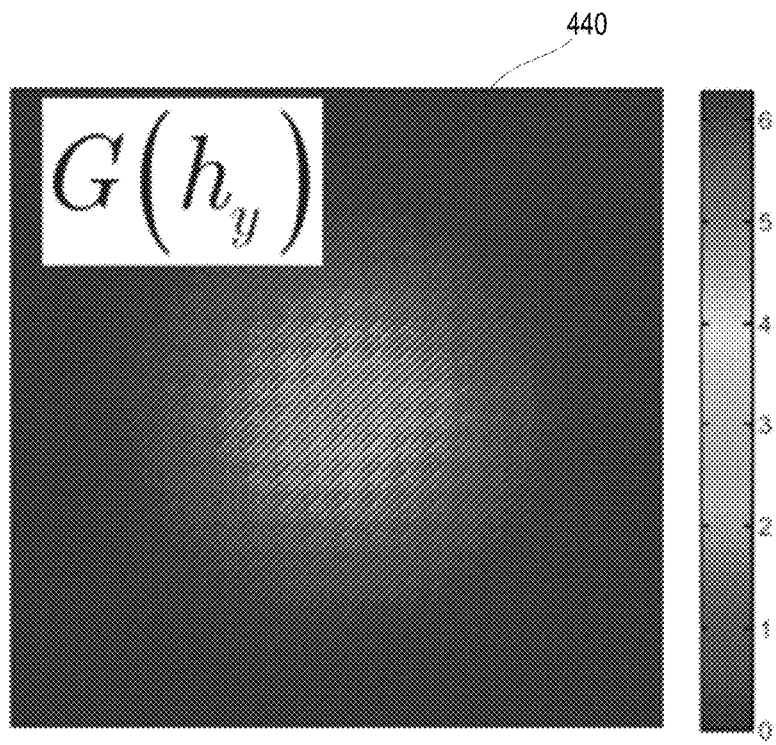
Figure 4E:
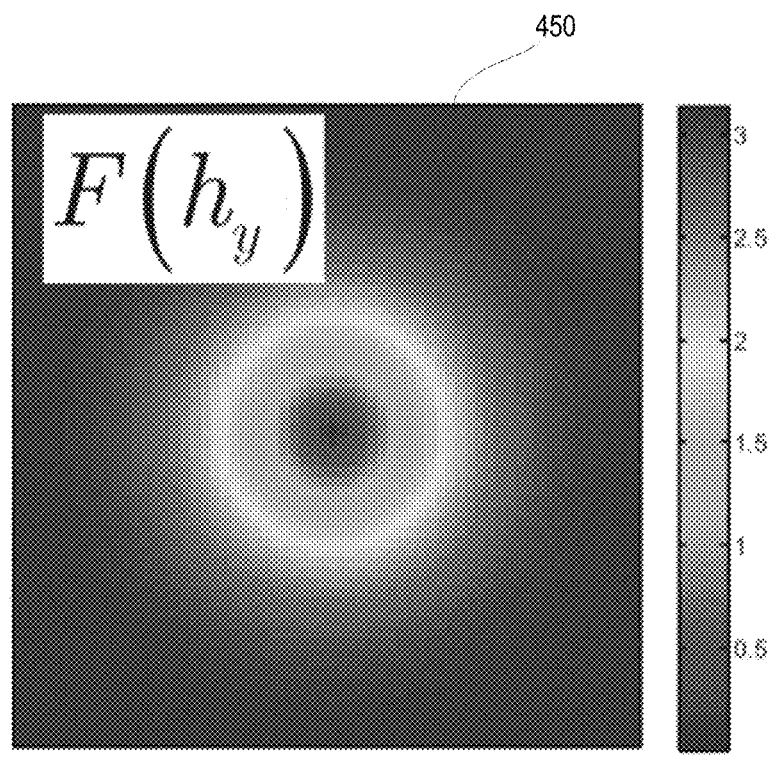

FIGS. 4D-E are two-dimensional graphs illustrating functions G and F that are grouped under $S_y$.

Figure 4F:
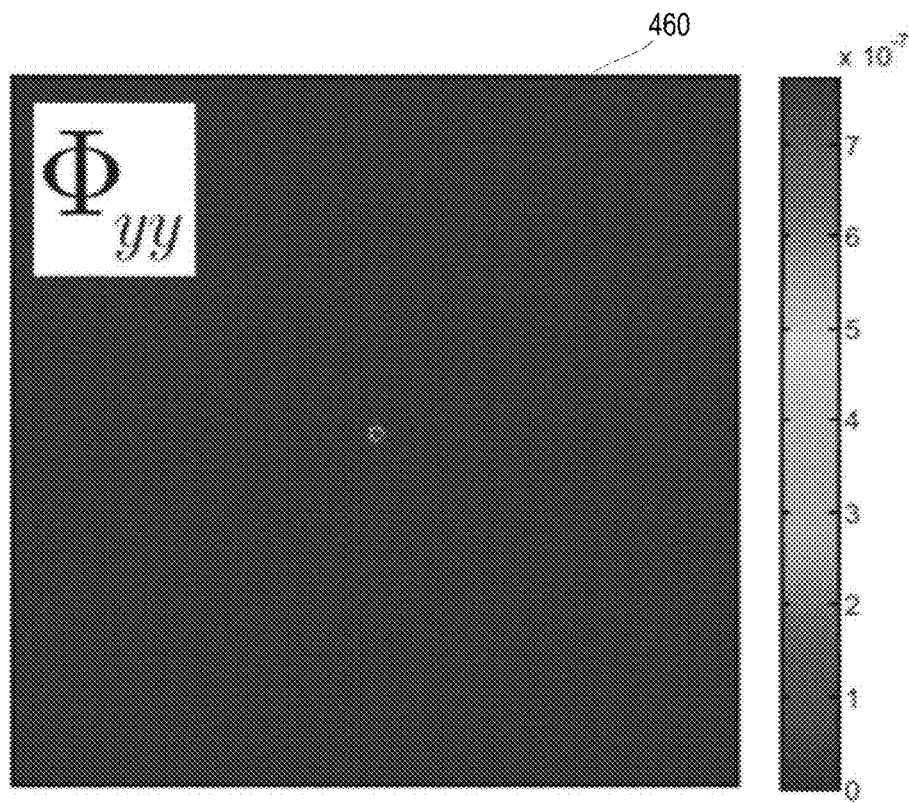

FIG. 4F is a two-dimensional graph of the spatial power spectrum $\Phi_{yy}$.

Figure 4G:
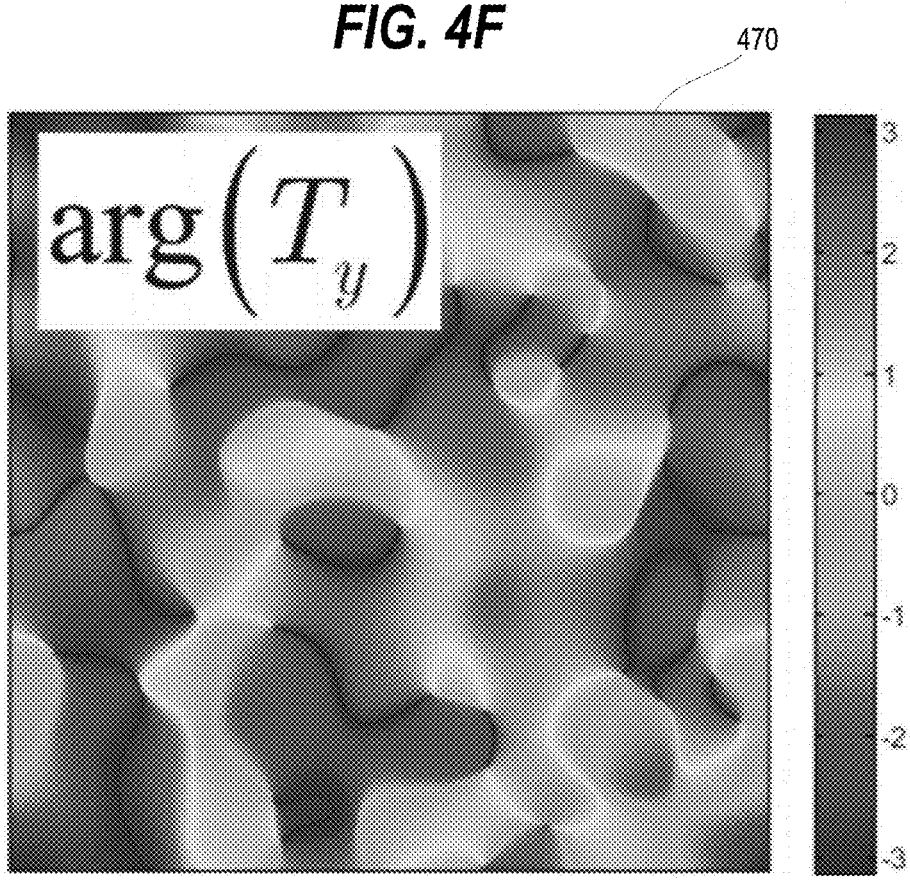

FIG. 4G is a two-dimensional graph of an instance of arg $(T_y)$, which is grouped below $\mu_{yy}$.

Figure 4H:
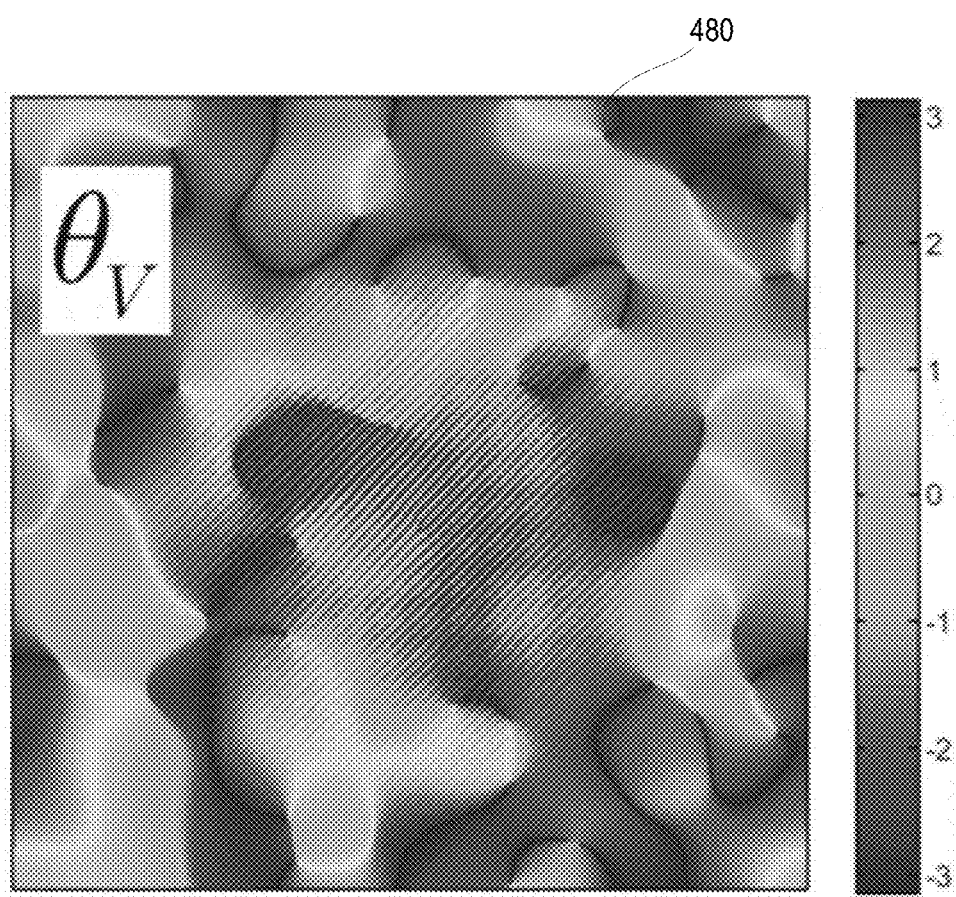

FIG. 4H is a two-dimensional graph of screen $\theta_{y'}$.

Figure 5A:
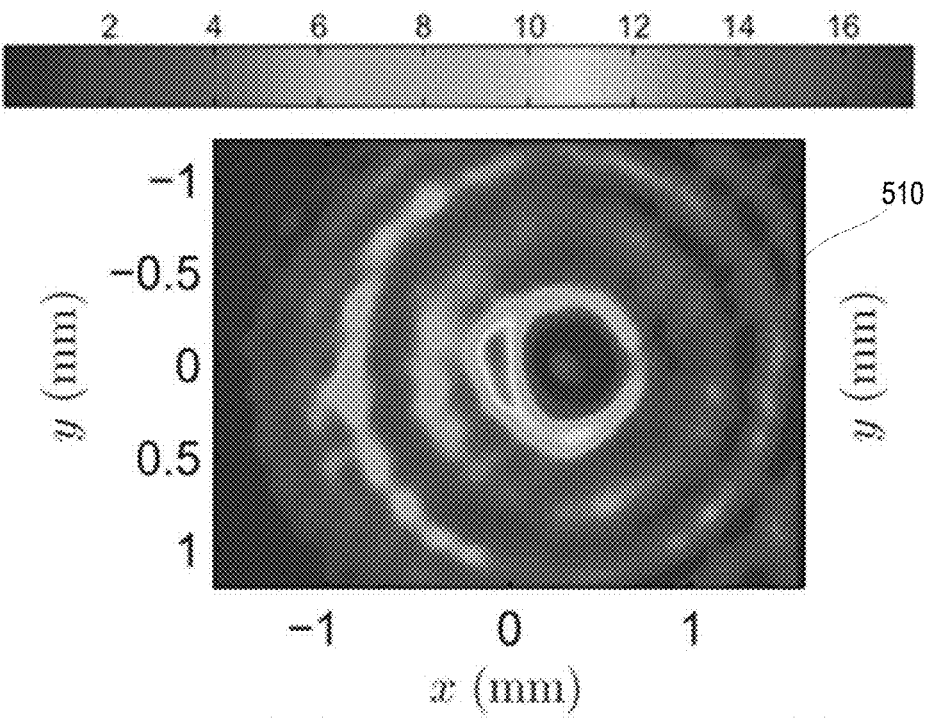

FIG. 5A is a two-dimensional graph of example $I_x$ for the electromagnetic nonuniformly correlated (ENUC) source.

Figure 5B:
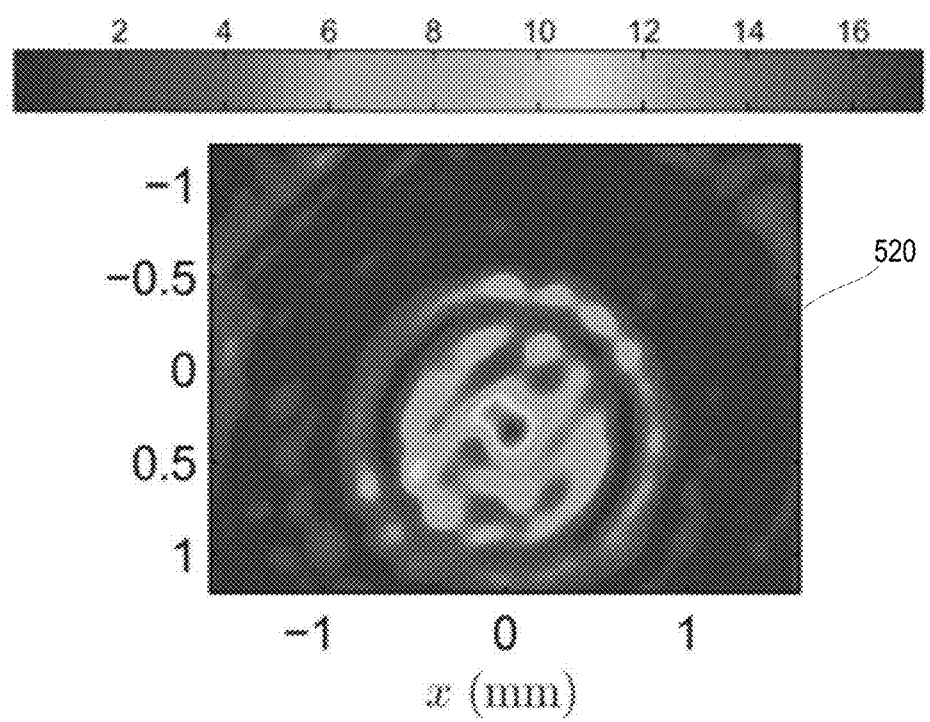

FIG. 5B is a two-dimensional graph of example $I_y$ for the ENUC source.

Figure 5C:
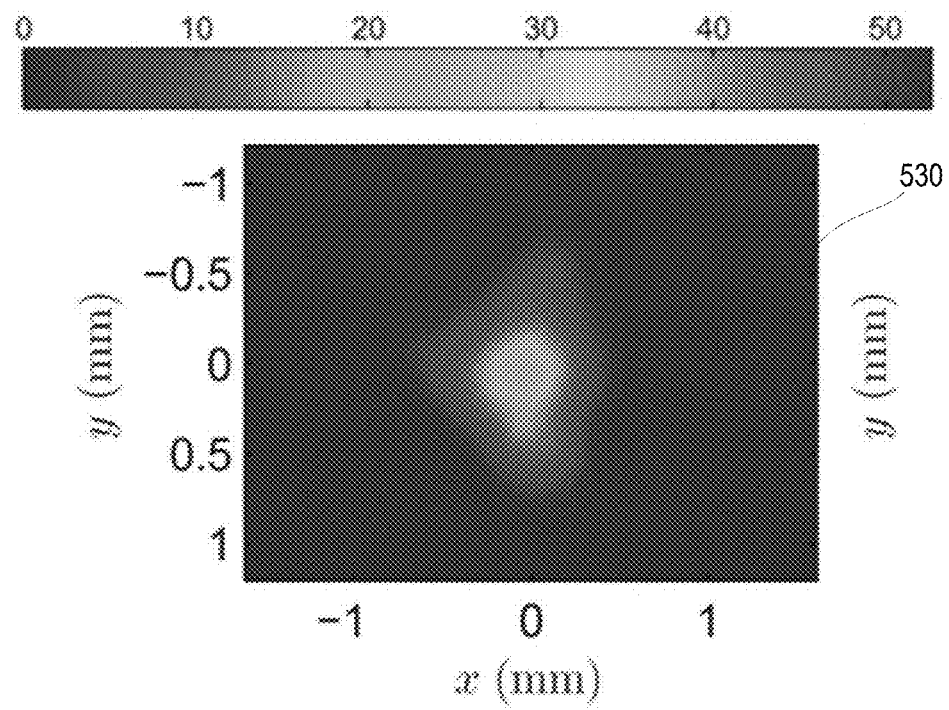

FIG. 5C is a two-dimensional graph of example Ix for the EMGSM source.

Figure 5D:
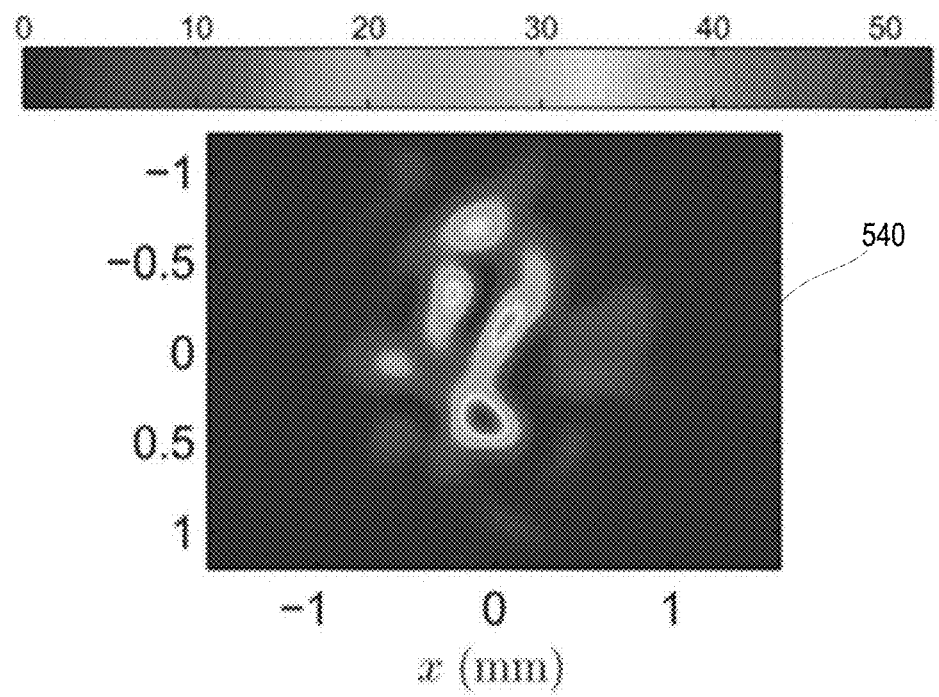

FIG. 5D is a two-dimensional graph of example $I_y$ for the EMGSM source.

Figure 6A:
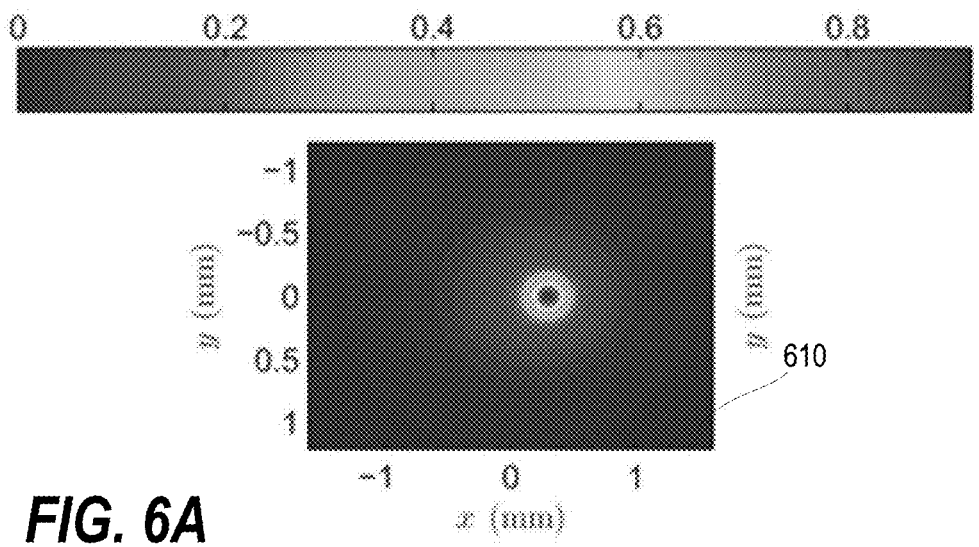

FIG. 6A is a two-dimensional graph of the theoretical ENUC source near-field normalized spectral density $\tilde{S}_x$.

Figure 6B:
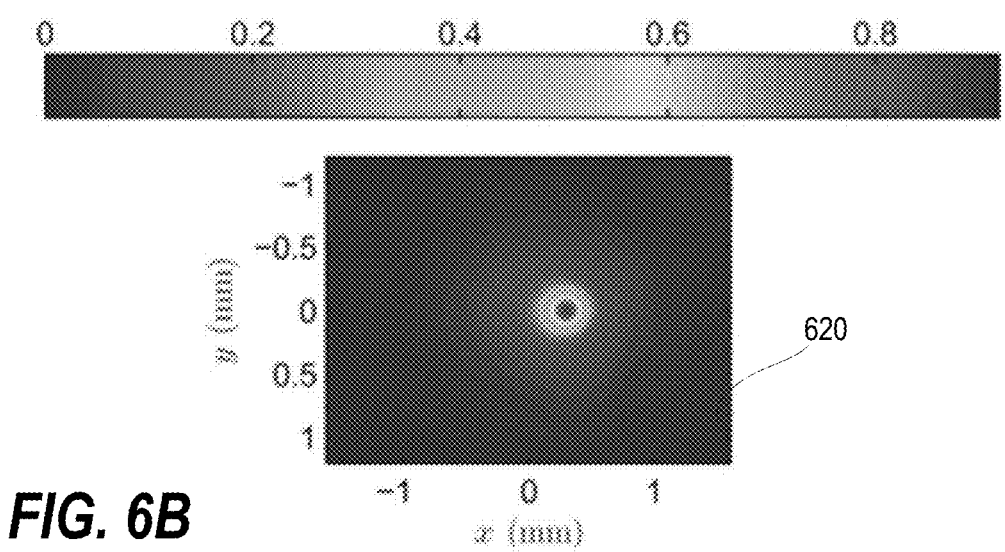

FIG. 6B is a two-dimensional graph of the experimental ENUC source near-field normalized spectral density $\tilde{S}_x$.

Figure 6C:
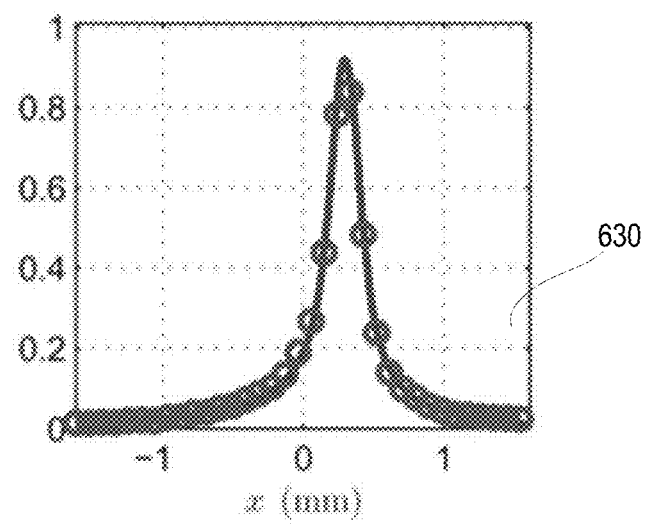

FIG. 6C is a two-dimensional graph of the ENUC source near-field normalized spectral density $\tilde{S}_x y=0$ slice theory versus experiment.

Figure 6D:
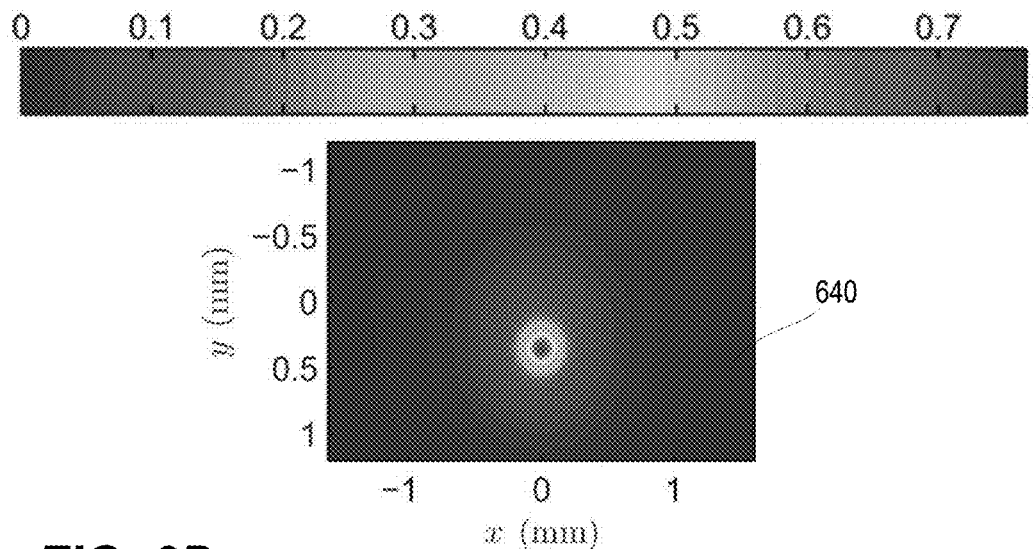

FIG. 6D is a two-dimensional graph of the theoretical ENUC source near-field normalized spectral density $\tilde{S}_y$.

Figure 6E:
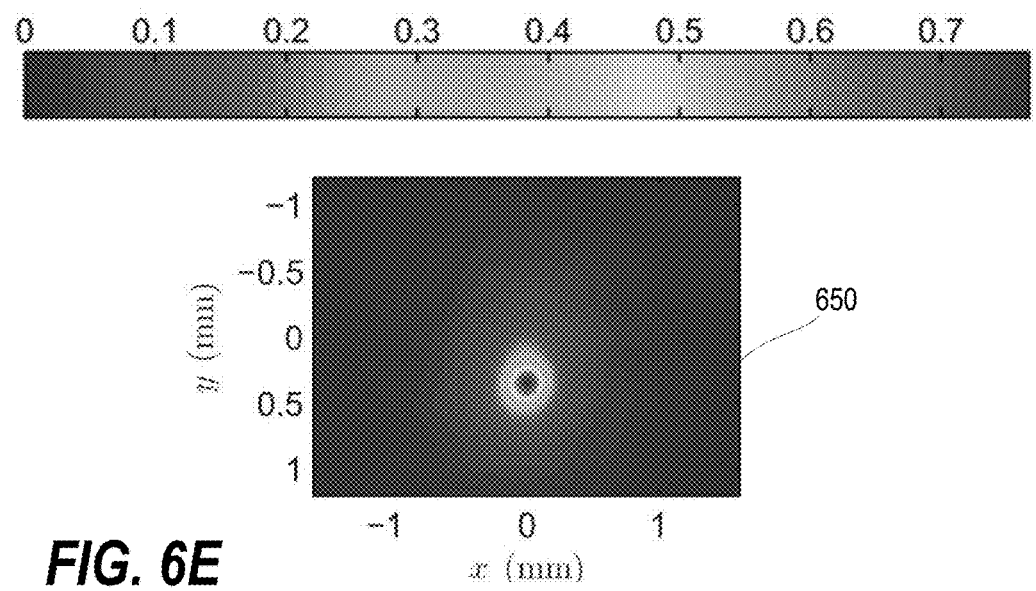

FIG. 6E is a two-dimensional graph of the experimental ENUC source near-field normalized spectral density $\tilde{S}_y$.

Figure 6F:
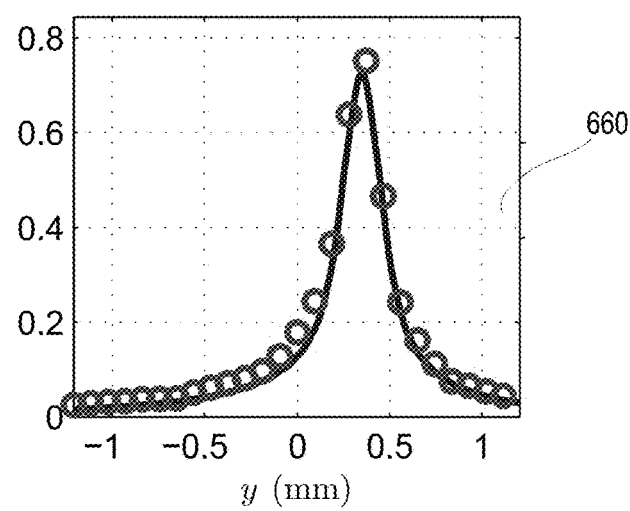

FIG. 6F is a two-dimensional graph of the ENUC source near-field normalized spectral density $\tilde{S}_y x=0$ slice theory versus experiment.

Figure 7A:
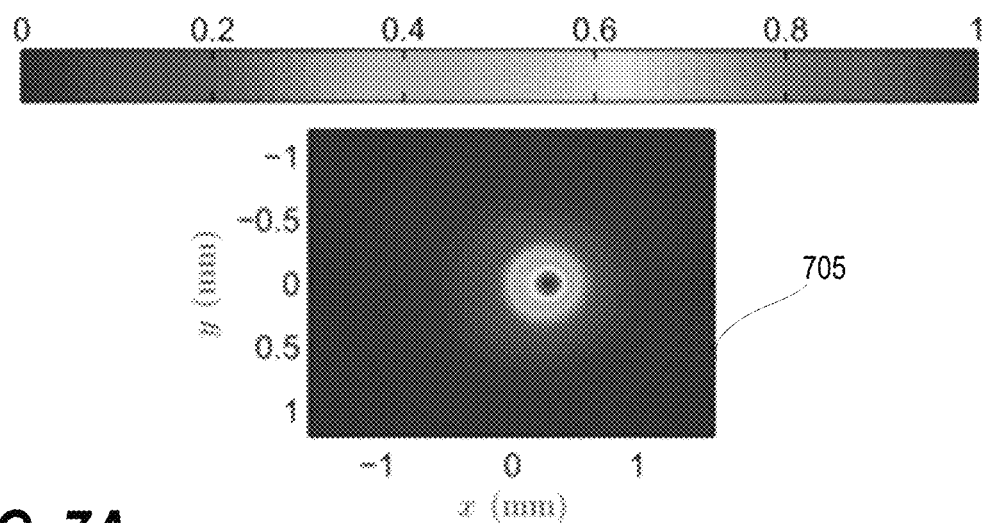

FIG. 7A is a two-dimensional graph of the theoretical ENUC source near-field normalized correlation of irradiance $\tilde{\Gamma}_{xx}$.

Figure 7B:
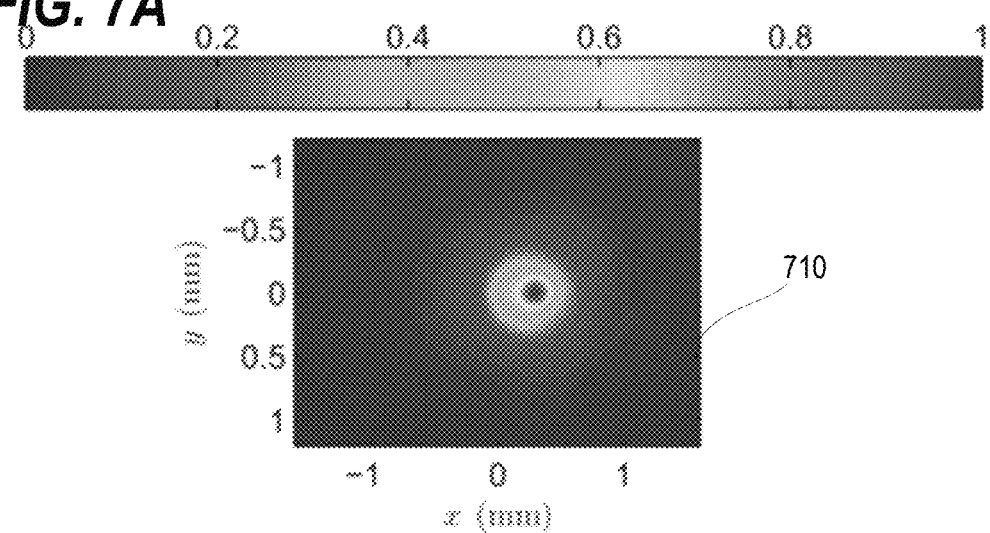

FIG. 7B is a two-dimensional graph of the experimental ENUC source near-field normalized correlation of irradiance $\tilde{\Gamma}_{xx}$.

Figure 7C:
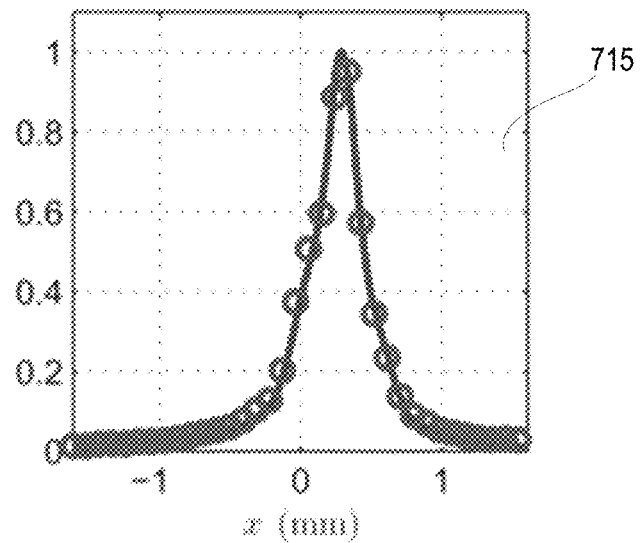

FIG. 7C is a two-dimensional graph of the ENUC source near-field normalized correlation of irradiance $\tilde{\Gamma}_{xx} y=0$ slice theory versus experiment.

Figure 7D:
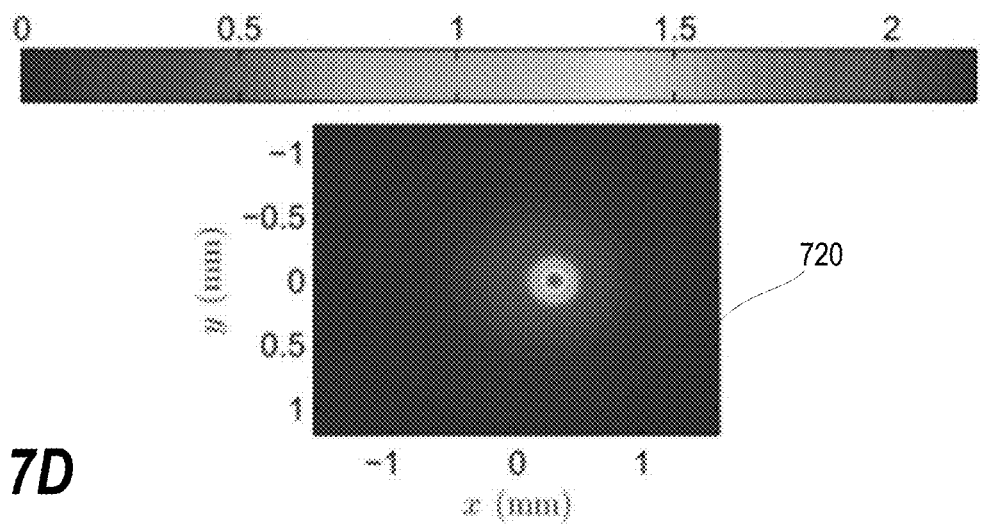

FIG. 7D is a two-dimensional graph of the theoretical ENUC source near-field normalized correlation of irradiance $\tilde{\Gamma}_{xy}$.

Figure 7E:
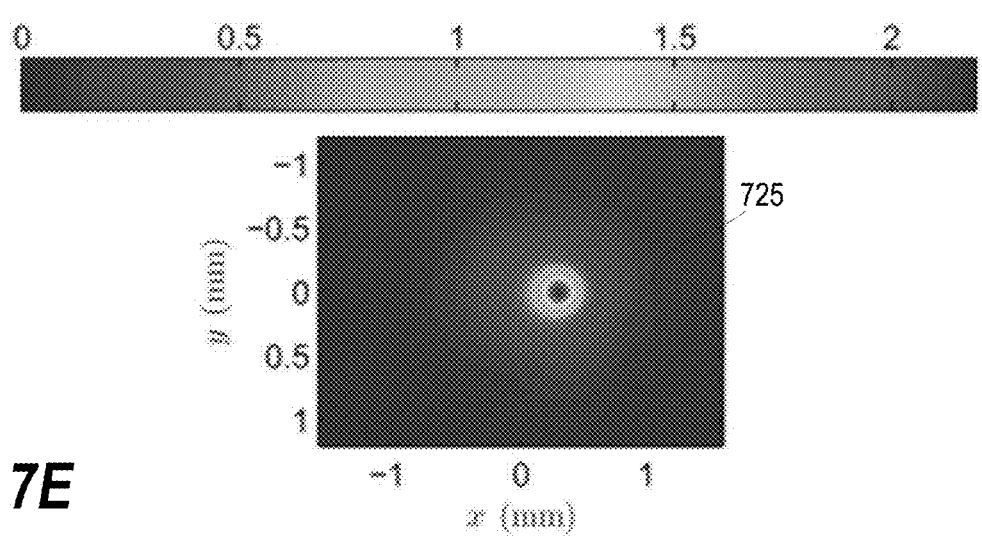

FIG. 7E is a two-dimensional graph of the experimental ENUC source near-field normalized correlation of irradiance $\tilde{\Gamma}_{xy}$.

Figure 7F:
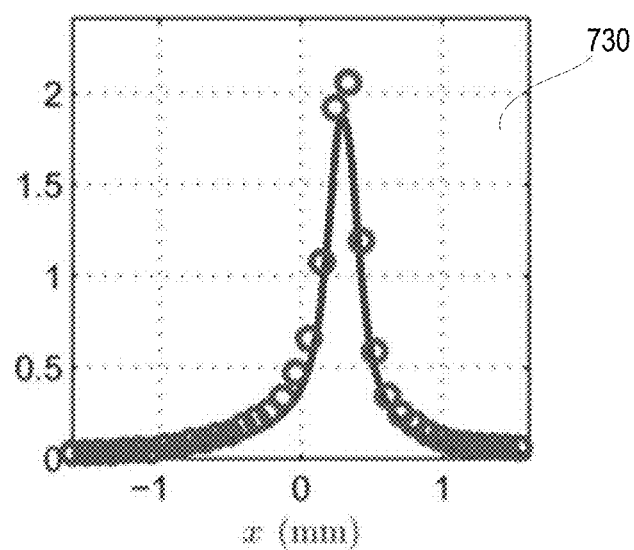

FIG. 7F is a two-dimensional graph of the ENUC source near-field normalized correlation of irradiance $\tilde{\Gamma}_{xy} y=0$ slice theory versus experiment.

Figure 7G:
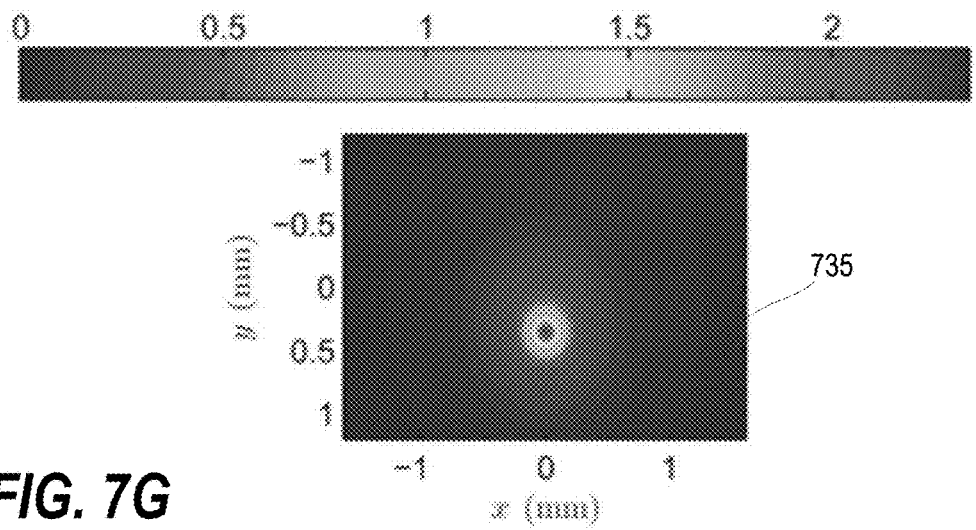

FIG. 7G is a two-dimensional graph of the theoretical ENUC source near-field normalized correlation of irradiance $\tilde{\Gamma}_{yx}$.

Figure 7H:
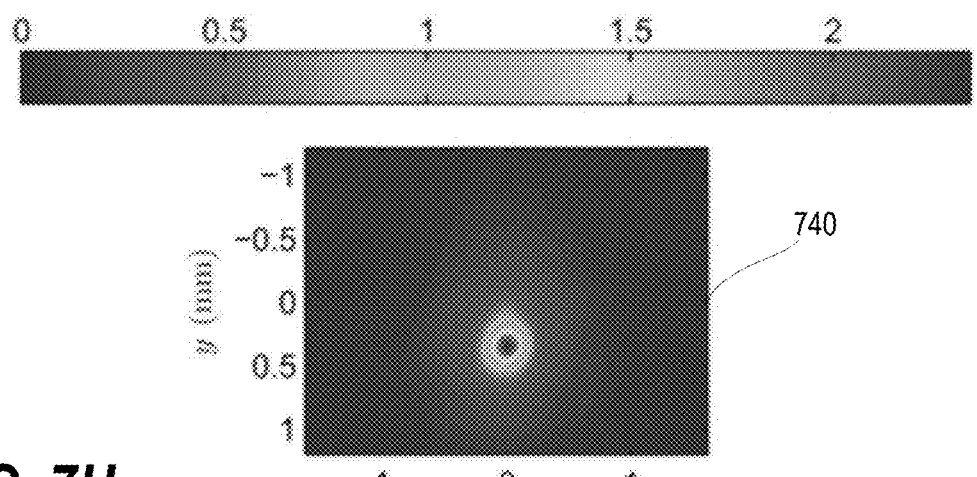

FIG. 7H is a two-dimensional graph of the experimental ENUC source near-field normalized correlation of irradiance $\tilde{\Gamma}_{yx}$.

Figure 7I:
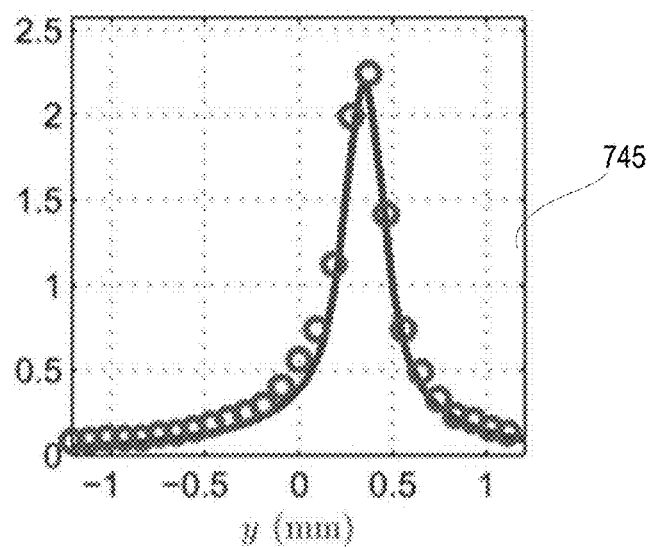

FIG. 7I is a two-dimensional graph of the ENUC source near-field normalized correlation of irradiance $\tilde{\Gamma}_{yx} x=0$ slice theory versus experiment.

Figure 7J:
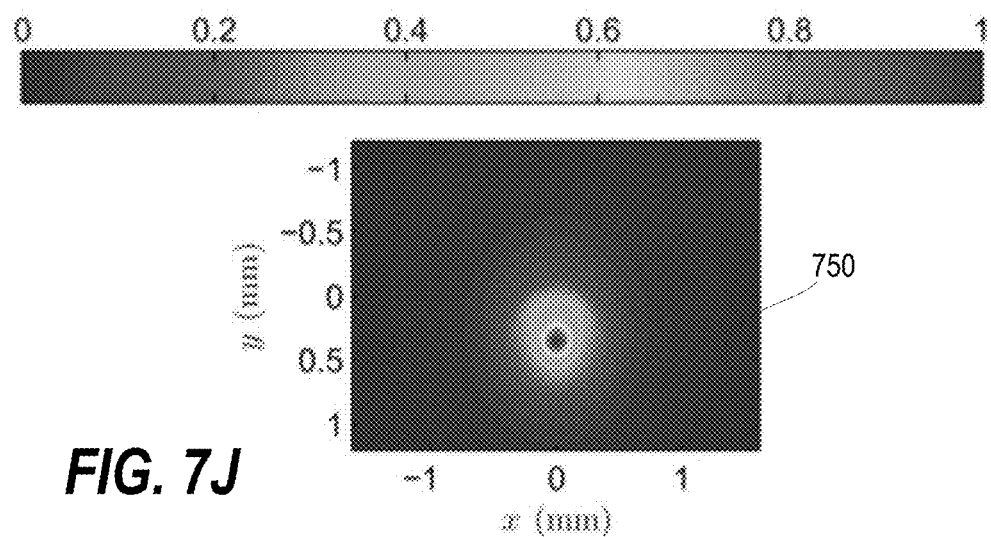

FIG. 7J is a two-dimensional graph of the theoretical ENUC source near-field normalized correlation of irradiance $\tilde{\Gamma}_{yy}$.

Figure 7K:
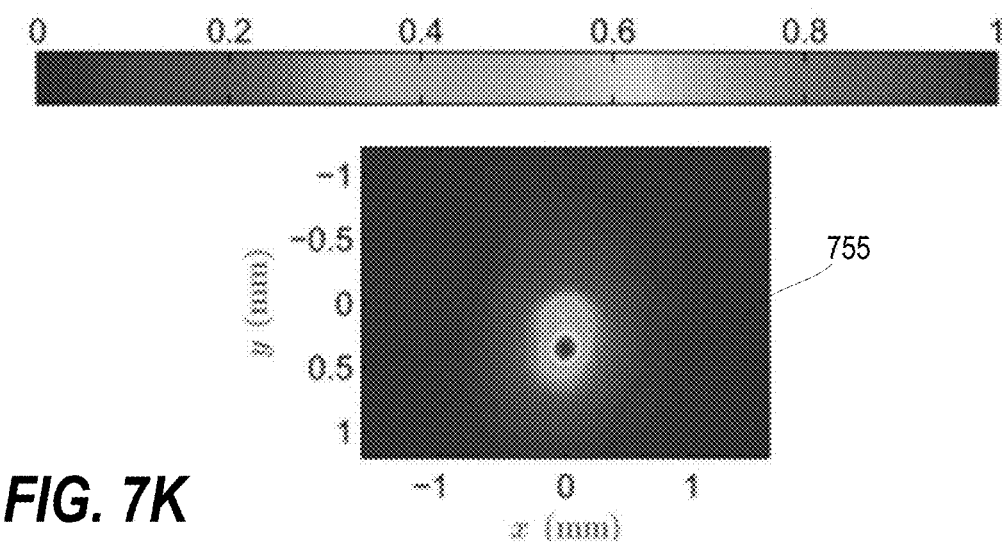

FIG. 7K is a two-dimensional graph of the experimental ENUC source near-field normalized correlation of irradiance $\tilde{\Gamma}_{yy}$.

Figure 7L:
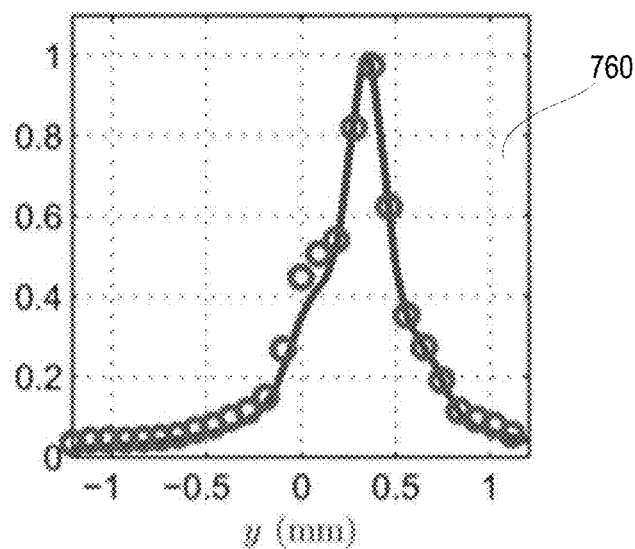

FIG. 7L is a two-dimensional graph of the ENUC source near-field normalized correlation of irradiance $\tilde{\Gamma}_{yy} x=0$ slice theory versus experiment.

Figure 8A:
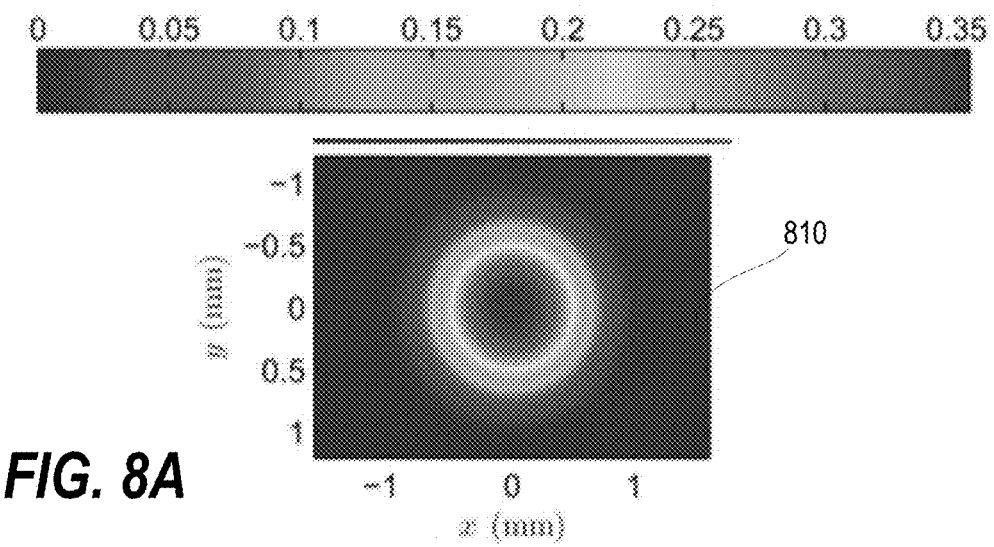

FIG. 8A is a two-dimensional graph of the theoretical EMGSM source far-zone normalized spectral density $\tilde{S}_x$.

Figure 8B:
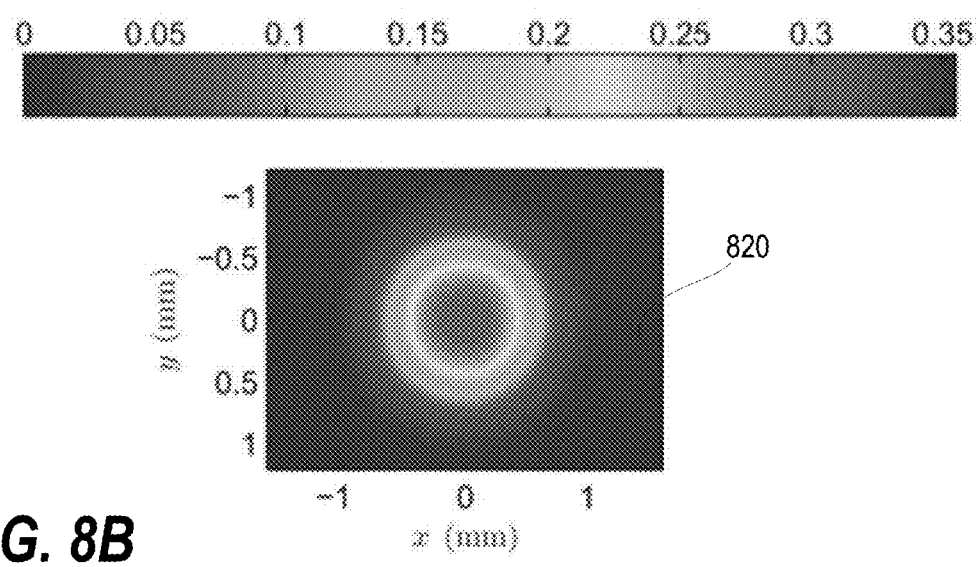

FIG. 8B is a two-dimensional graph of the experimental EMGSM source far-zone normalized spectral density $\tilde{S}_x$.

Figure 8C:
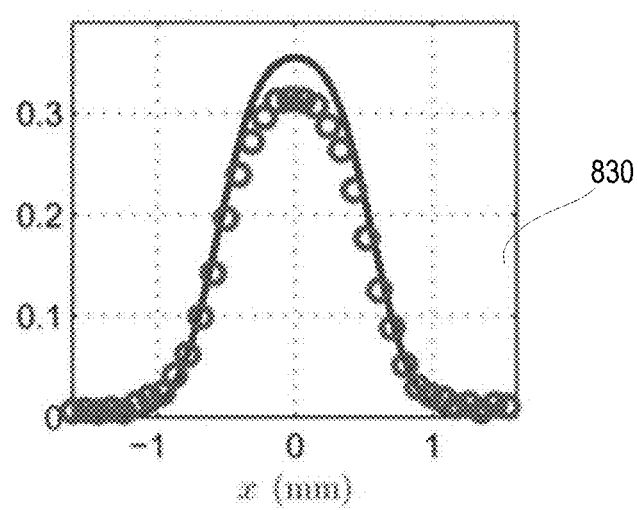

FIG. 8C is a two-dimensional graph of the EMGSM source far-zone normal-ized spectral density $\tilde{S}_x y=0$ slice theory versus experiment.

Figure 8D:
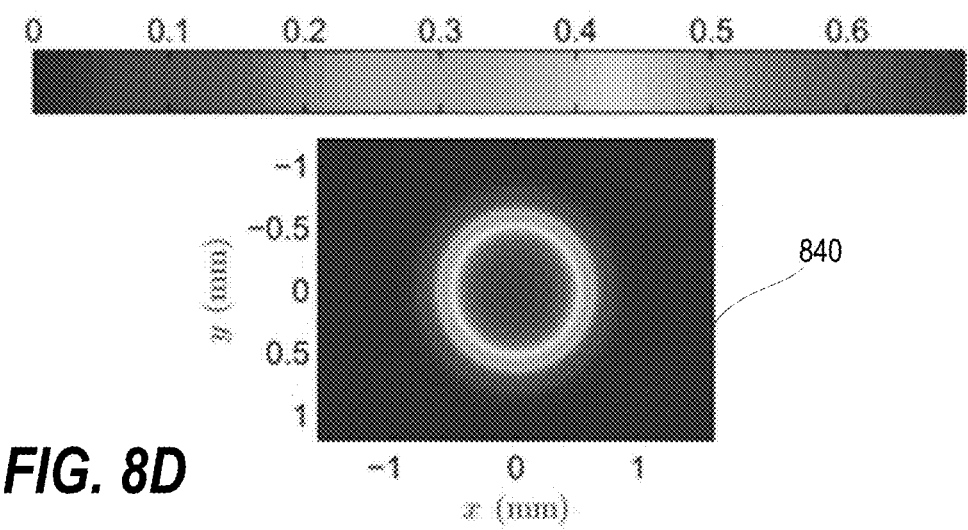

FIG. 8D is a two-dimensional graph of the theoretical EMGSM source far-zone normalized spectral density $\tilde{S}_y$.

Figure 8E:
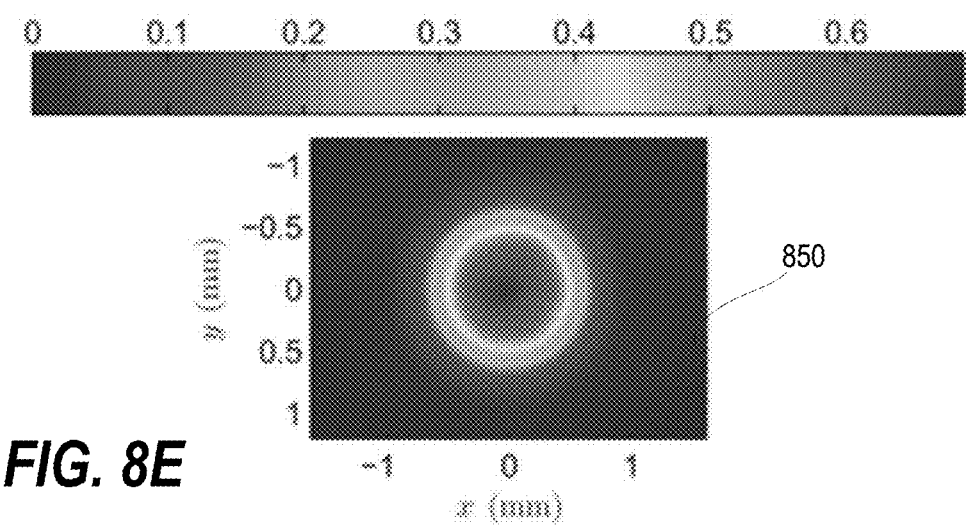

FIG. 8E is a two-dimensional graph of the experimental EMGSM source far-zone normalized spectral density $\tilde{S}_y$.

Figure 8F:
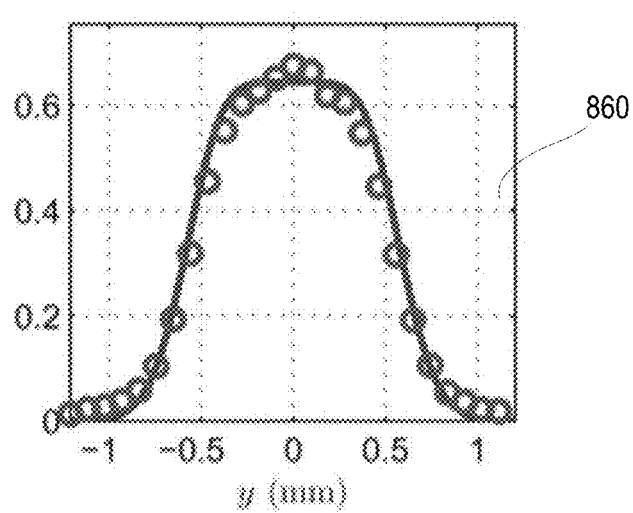

FIG. 8F is a two-dimensional graph of the EMGSM source far-zone normalized spectral density $\tilde{S}_y x=0$ slice theory versus experiment.

Figure 9A:
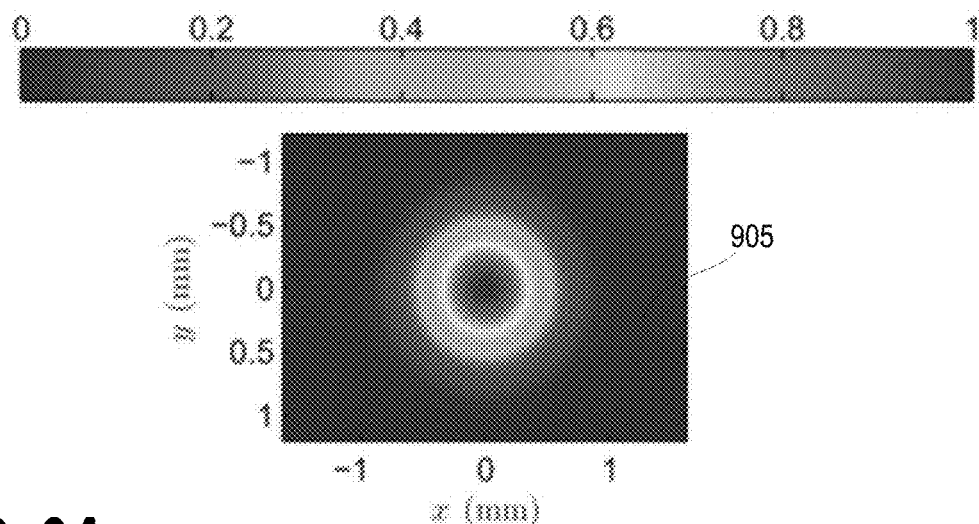

FIG. 9A is a two-dimensional graph of the theoretical EMGSM source far-zone normalized correlation of irradiance $\tilde{\Gamma}_{xx}$.

Figure 9B:
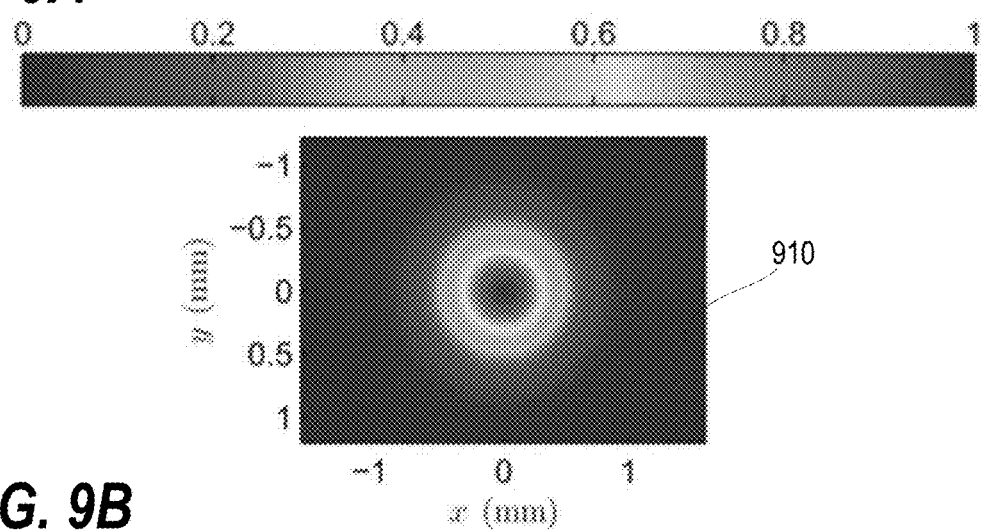

FIG. 9B is a two-dimensional graph of the experimental EMGSM source far-zone normalized correlation of irradiance $\tilde{\Gamma}_{xx}$.

Figure 9C:
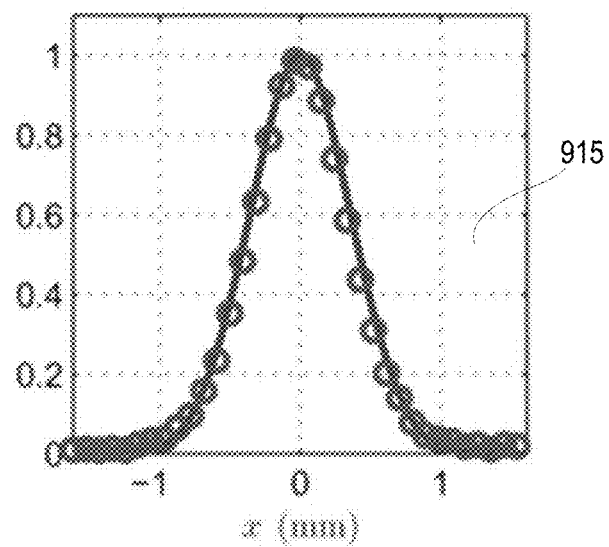

FIG. 9C is a two-dimensional graph of the EMGSM source far-zone normalized correlation of irradiance $\tilde{\Gamma}_{xx} y=0$ slice theory versus experiment.

Figure 9D:
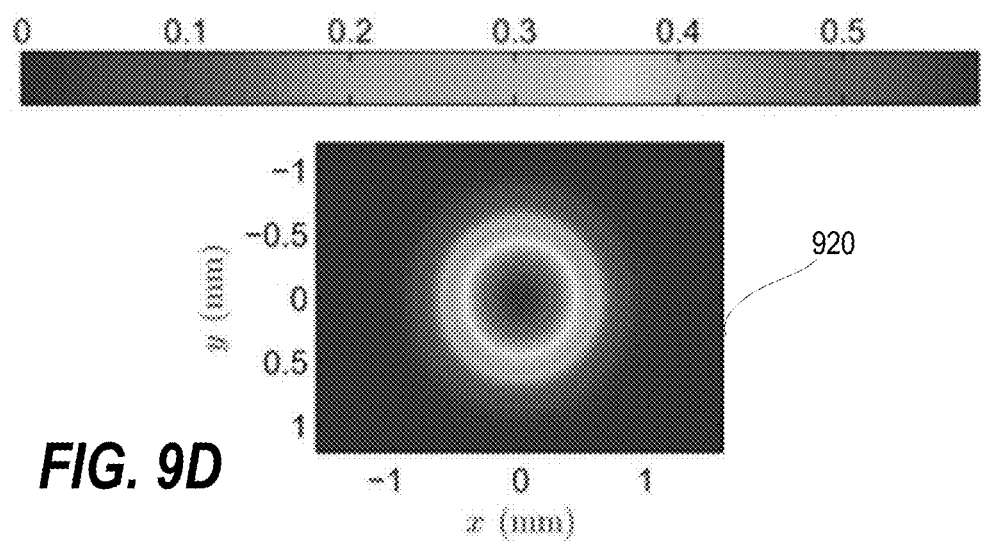

FIG. 9D is a two-dimensional graph of the theoretical EMGSM source far-zone normalized correlation of irradiance $\tilde{\Gamma}_{xy}$.

Figure 9E:
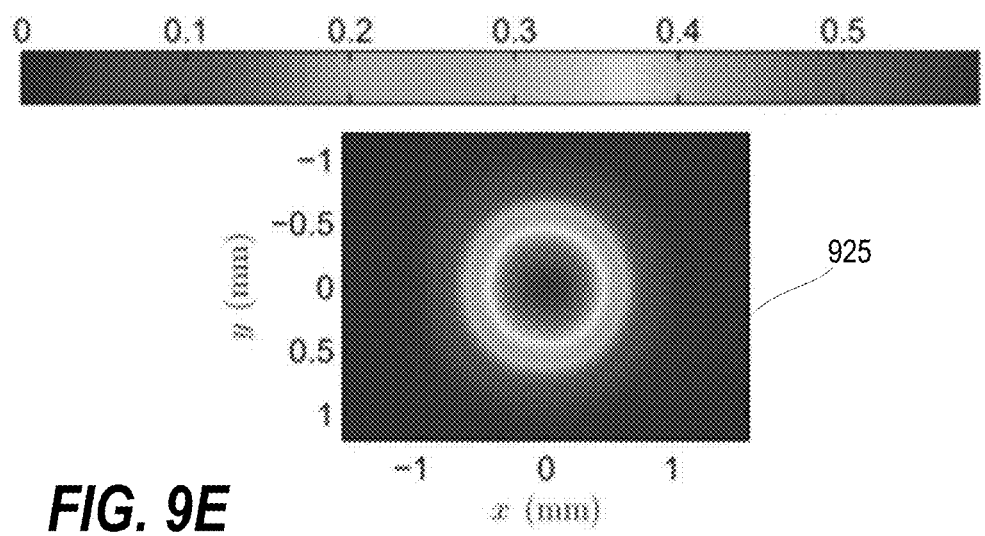

FIG. 9E is a two-dimensional graph of the experimental EMGSM source far-zone normalized correlation of irradiance $\tilde{\Gamma}_{xy}$.

Figure 9F:
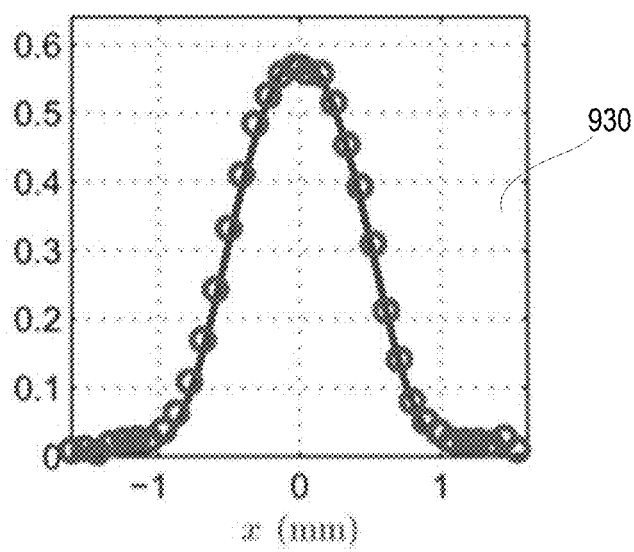

FIG. 9F is a two-dimensional graph of the EMGSM source far-zone normalized correlation of irradiance $\tilde{\Gamma}_{xy} y=0$ slice theory versus experiment.

Figure 9G:
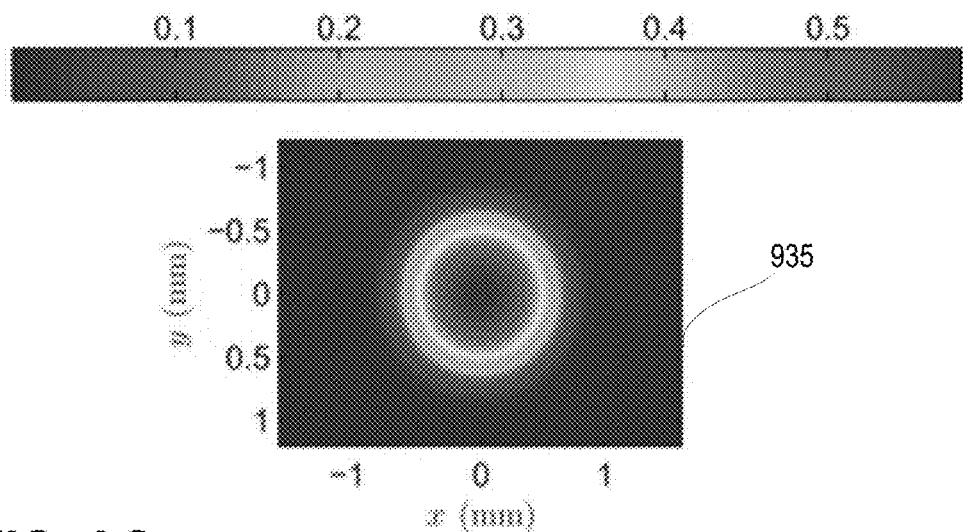

FIG. 9G is a two-dimensional graph of the theoretical EMGSM source far-zone normalized correlation of irradiance $\tilde{\Gamma}_{yx}$.

Figure 9H:
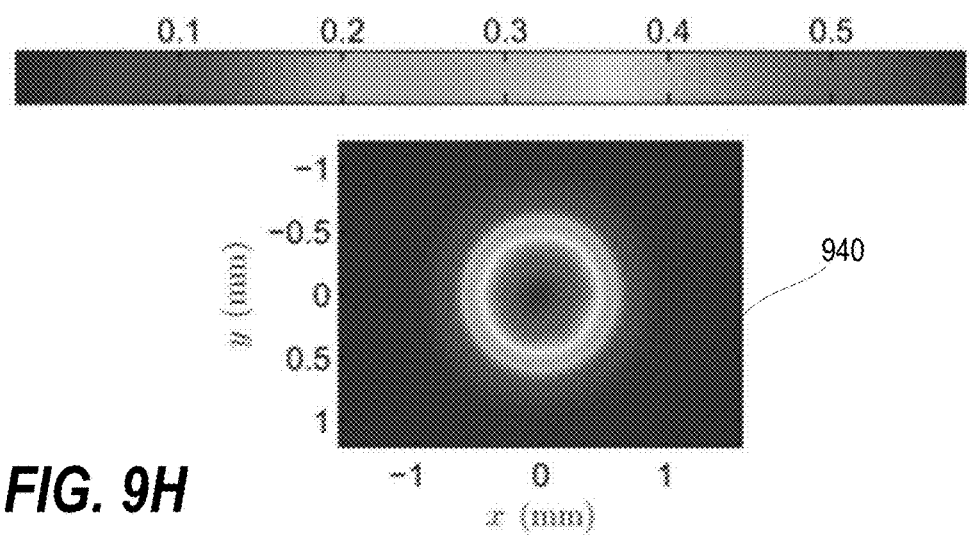

FIG. 9H is a two-dimensional graph of the experimental EMGSM source far-zone normalized correlation of irradiance $\tilde{\Gamma}_{yx}$.

Figure 9I:
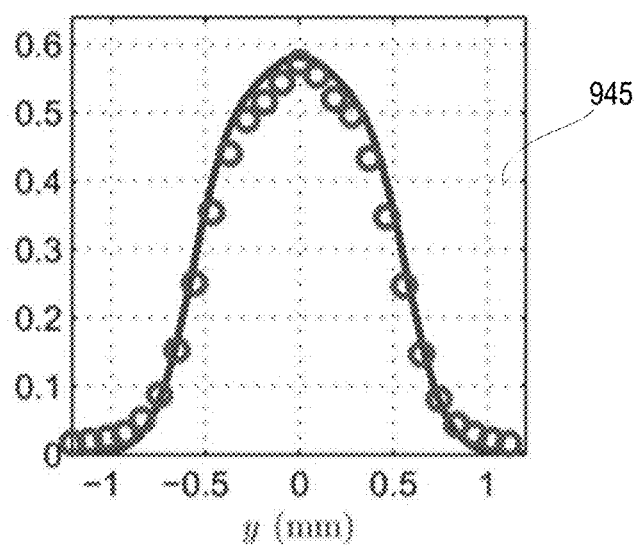

FIG. 9I is a two-dimensional graph of the EMGSM source far-zone normalized correlation of irradiance $\tilde{\Gamma}_{yx} x=0$ slice theory versus experiment.

Figure 9J:
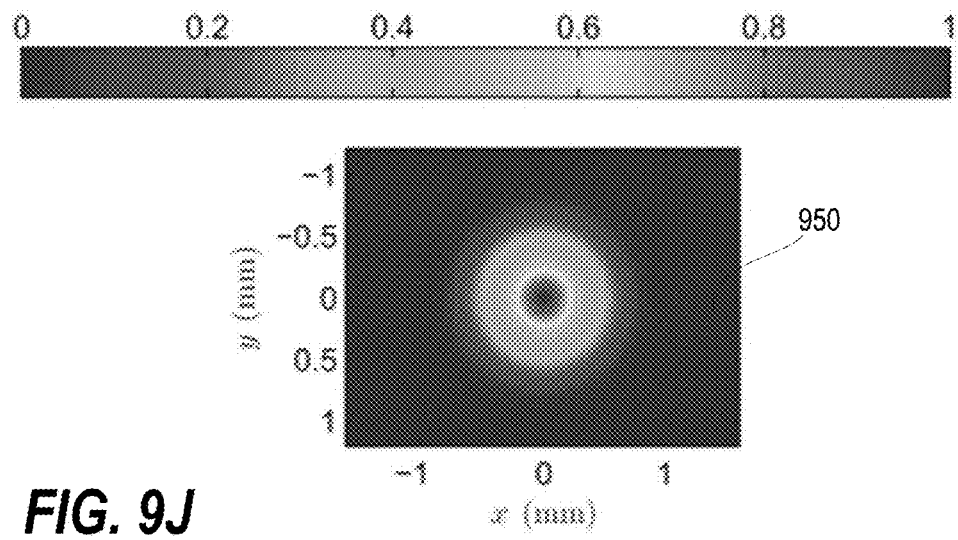

FIG. 9J is a two-dimensional graph of the theoretical EMGSM source far-zone normalized correlation of irradiance $\tilde{\Gamma}_{yy}$.

Figure 9K:
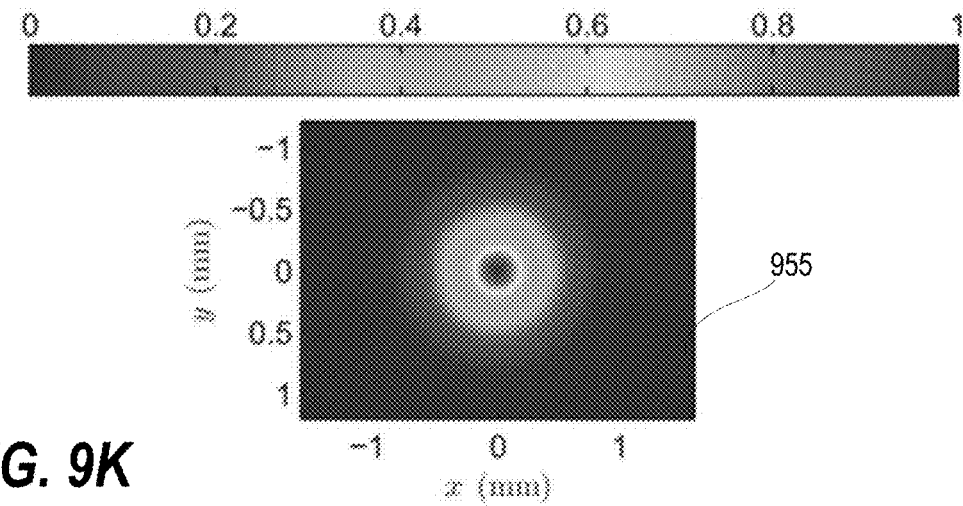

FIG. 9K is a two-dimensional graph of the experimental EMGSM source far-zone normalized correlation of irradiance $\tilde{\Gamma}_{yy}$.

Figure 9L:
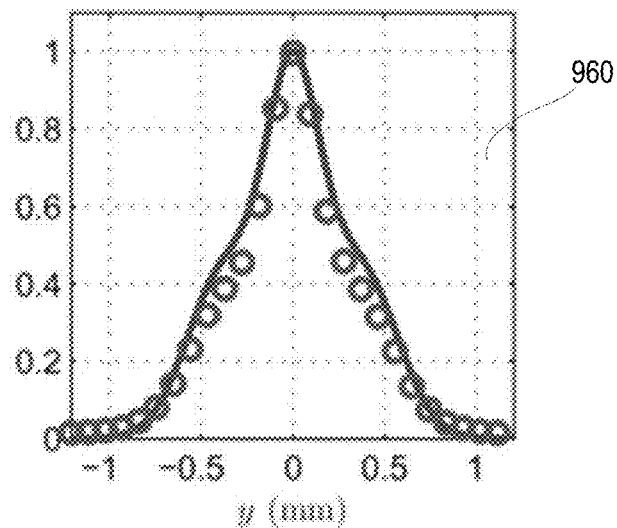

FIG. 9L is a two-dimensional graph of the EMGSM source far-zone normalized correlation of irradiance $\tilde{\Gamma}_{yy} x=0$ slice theory versus experiment.

DETAILED DESCRIPTIONS

The present innovation makes it simpler to construct and significantly increases the flexibility of VPCS generators by allowing many different types of sources to be produced without changing the physical set-up.

In contrast with existing designs, the apparatus presented here uses only liquid crystal (LC) SLMs to control coherence and beam shape. This improvement permits many different types of sources to be generated without physically changing the apparatus. The system design and subsequent approach for generating VPCSs presented in this disclosure will be useful in any application where control over beam shape, spatial coherence, and polarization are required. These applications include but are not limited to free-space optical communications, directed energy, remote sensing, manufacturing, and medicine.

In this disclosure, a simple and flexible design for generating VPCSs is presented. Like existing designs, the proposed system uses a MZI where, in each interferometer leg, the beam shape and coherence of the components are controlled separately. In contrast with existing designs, the apparatus presented here uses only SLMs to control coherence and beam shape. This improvement permits many different types of sources to be generated without physically changing the apparatus.

Figure 1:
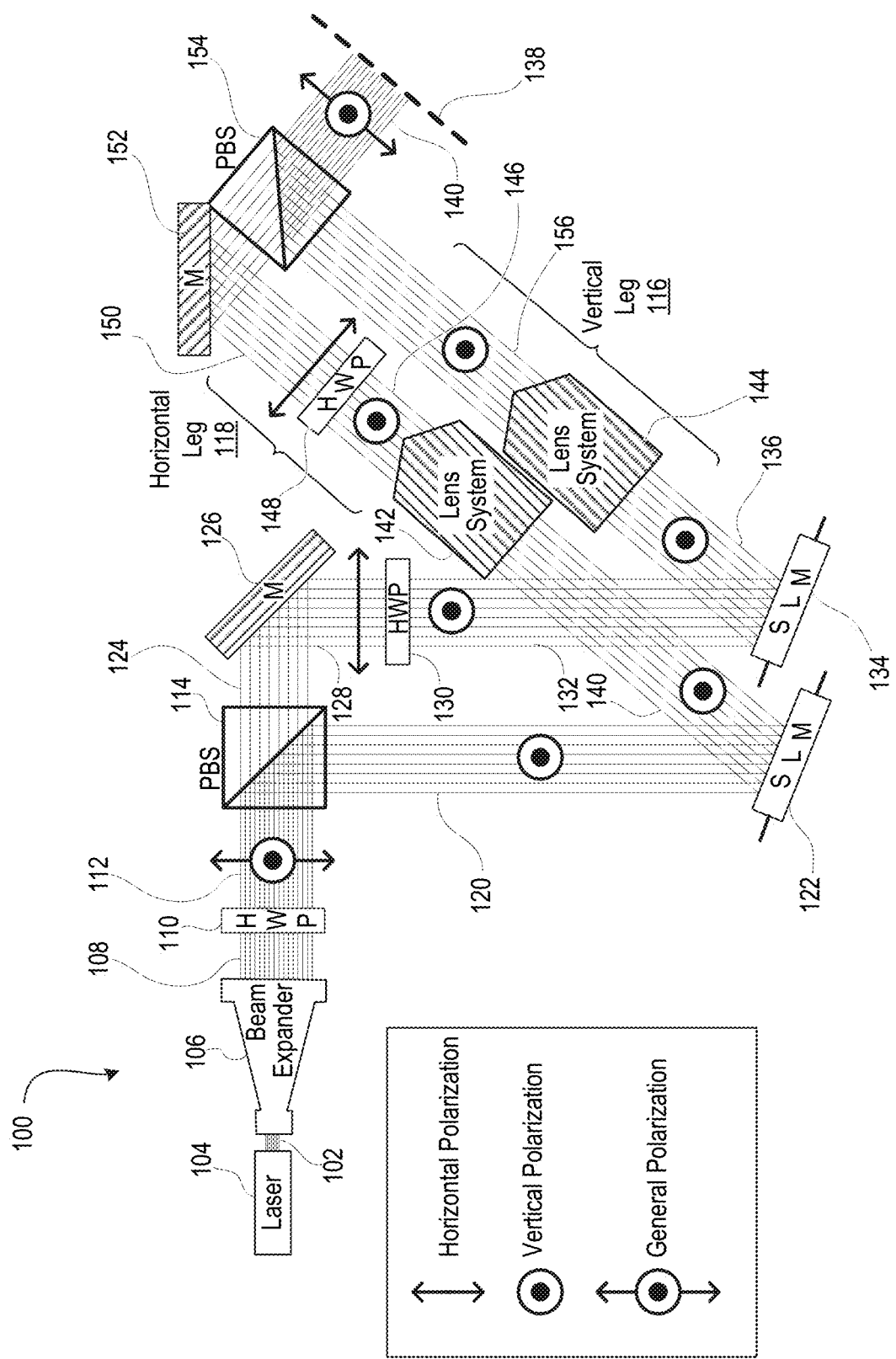
FIG. 1 is a schematic of a VPCS generator, according to one or more embodiments.

FIG. 1 is a schematic of a proposed generator 100 that produces VPCSs. Generator 100 separately controls the beam shape and coherence of the horizontal and vertical polarization components of light field 102 output by laser 104. The polarization state of the light passing through the apparatus is denoted by two-sided arrows (horizontal polarization) and dotted circles (vertical polarization). When both symbols are present, the light is in a general polarization state, i.e. polarized, partially polarized, or unpolarized. Linearly polarized light field 102 from laser 104 traverses beam expander (BE)106, becoming expanded light field 108 that traverses first half-wave plate (HWP)110. First HWP 110 transforms the linearly polarized light field 102 to 45° polarized light field 112, enabling subsequent first PBS 114 to split the power equally between vertical and horizontal interferometer legs 116, 118. In one or more embodiments, first PBS 114 reflects half of the 45° polarized light field 112 as vertically polarized light 120 to be reflected off of first SLM 122 into horizontal interferometer leg 118. First PBS 114 transmits the other half of the 45° polarized light field 112 as horizontally polarized light 124 to be reflected off of first mirror 126. Reflected horizontally polarized light 128 traverses second HWP 130 to become vertically polarized light 132 that is incident on second SLM 134 and then into vertical interferometer leg 116. Vertical interferometer leg 116 controls the vertical polarization component of the output light field 136 of generator 100 at source plane 138. Horizontal interferometer leg 118 controls the horizontal polarization component of the output light field 140 of generator 100 at source plane 138.

SLMs 122, 134 perform all beam shaping, phasing, and relative amplitude control of incident light fields 120, 132, respectively on the horizontal and vertical legs 118, 116. In one or more embodiments, light field control is accomplished using the modified phase screen (MPS) technique [46], which is discussed below. After the SLMs 122, 134, the light enters general lens systems (LSs) 142, 144, respectively. These LSs 142, 144 could be spatial filters, 4-f systems, et cetera and are included to remove unwanted diffraction orders, produced by the SLMs 122, 134, which may corrupt the desired source output. Note that the coherence length of the laser 104 must be considered when building the system. If the optical path difference (OPD) between the horizontal and vertical legs 118, 116 is greater than the coherence length of the laser 104, only partially coherent beams with diagonal cross-spectral density (CSD) matrices (discussed below) can be generated.

After traversing LS 142, filtered light 146 in the horizontal leg 118 traverses third HWP 148 to rotate its polarization state from vertical (the SLM control state) to horizontal yielding horizontal leg output light 150. Horizontal leg output light 150 is reflected off second mirror 152 for transmission through second PBS 154. Filtered light from LS 144 provides vertical leg output light 156 that is recombined in second PBS 154 with horizontal leg output light 150 to provide output light field 140. Output light field 140 provides a VPCS at source plane 138. The exact location of the source plane 138 is determined by LSs 142, 144.

In one or more embodiments, SLMs 122, 134 are reflective, phase-only SLMs. In one or more embodiments, SLMs 122, 134 are transmissive SLMs with corresponding changes in optical layout. For clarity, FIG. 1 illustrates that the SLM control state is vertical; thus, second HWP 130 is used on the vertical leg (immediately after first PBS 114 and first mirror 126) to transform horizontal linear polarization into vertical polarization.

Figure 2:
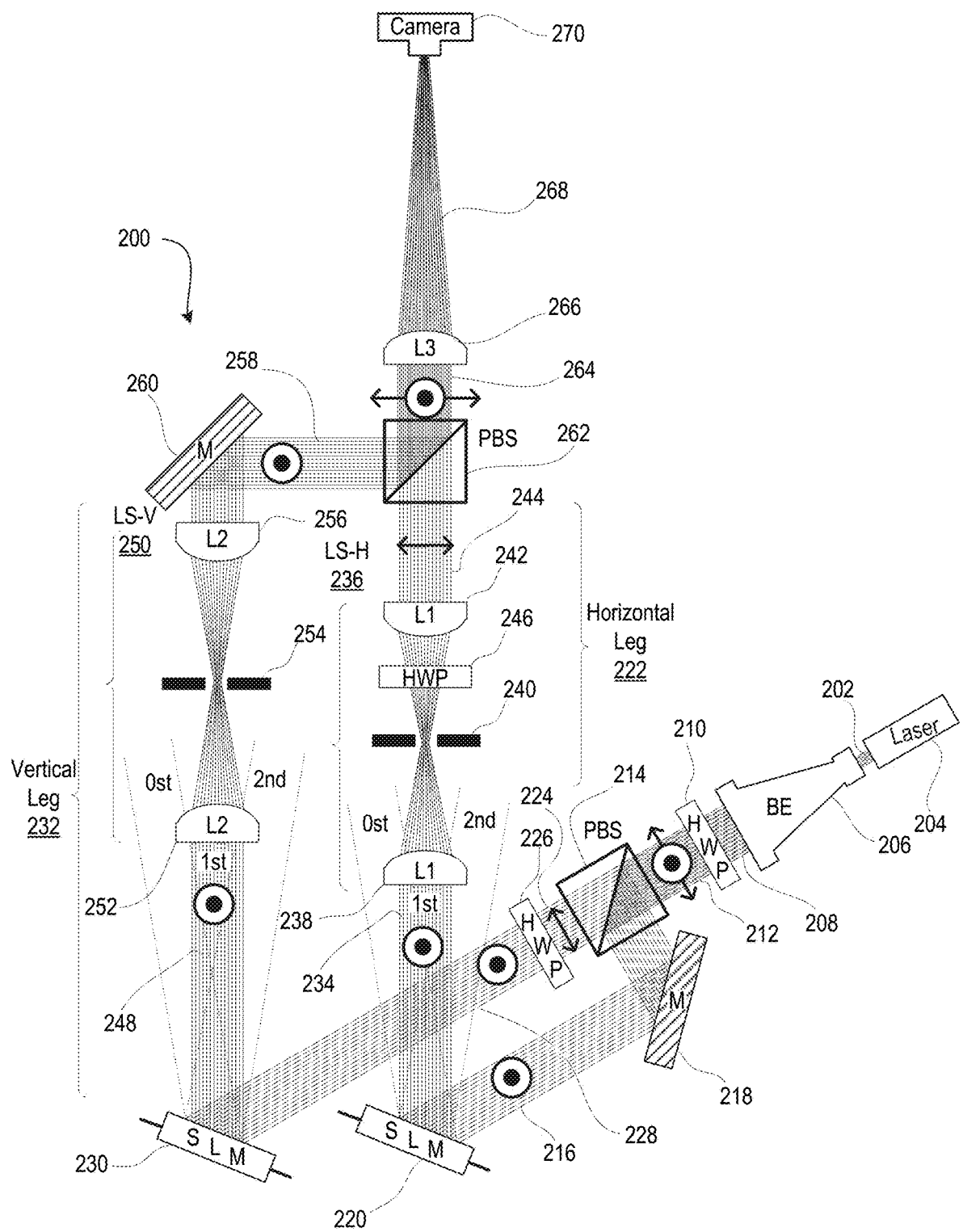
FIG. 2 is a schematic of an experimental VPCS generator, according to one or more embodiments.

Experimental Set-Up for Invention Validation: FIG. 2 illustrates a schematic of the VPCS generator 200 used in the validation experiments. Light 202 from laser 204 traverses BE206 to produce expanded light field 208 that in turn passes through first HWP 210 to produce 45° polarized light 212. First PBS 214 deflects half of the 45° polarized light 212 as vertically polarized light 216 that reflects off of first mirror (M) 218 and is incident on first SLM 220 of horizontal leg 222. First PBS 214 transmits the other half of 45'polarized light 212 as horizontally polarized light 224 that traverses second HWP 226 to become vertically polarized light 228 that is incident on second SLM 230 of vertical leg 232. Vertically polarized light 234 in horizontal leg 222 traverses lens system horizontal (LS-H) 236 that includes positive lens (L1) 238 with iris (I) 240, at the focal point of L1 238, followed by lens 242 (same focal length as L1 238) to produce collimated light 244. A third HWP 246 inserted between I240 and lens 242 produces horizontally polarized light 244. Vertically polarized light 248 in vertical leg 232 traverses lens system vertical (LS-V) 250 that includes a positive lens (L2)252 with I254, at the focal point of L2252, followed by lens 256 (same focal length as L2 252) to produce collimated light 258. Second M 260 orients light 258 to be deflected by second PBS 262 to combine with light 244 transmitted from horizontal leg 222. Combined and collimated light 264 that exits second PBS 262 traverses positive lens (L3) 266 to focus converging light 268 on camera 270.

In the experimental embodiment, positive lenses L1 238, 242 are 350 mm lenses. Positive lenses L2 252, 256 are 375 mm lenses. L3 266 is a 1500 mm lens. The layout is slightly different than FIG. 1; the functionality is identical. Here, a helium-neon (HeNe) laser (632.8 nm)204 and two Boulder Nonlinear Systems (BNS) model P512-0635 SLMs 220, 230 [47] were used. The desired partially coherent field instances were produced in the horizontal 222 and vertical 232 leg first diffraction orders. Thus, the LSs 142, 144 of FIG. 1 were spatial filters (4-f system plus an I) and used to block all orders other than the first. Due to space constraints, the physical layout of FIG. 2 resulted in the vertical leg 232 being 100 mm longer than the horizontal leg 222 when measured from the SLMs 220, 230—the same difference was approximately 45 mm when measured from the laser 204. To place the output planes of both spatial filters at 266 (the source plane of the apparatus), the horizontal and vertical leg lenses (positive lenses L1238, 242 and positive lenses L2 252, 256, respectively) had focal lengths of 350 mm and 375 mm, respectively.

Recall that the coherence length of the source must be considered when building the system. The coherence length of the HeNe laser 204 used here was approximately 300 mm; therefore, the 45 mm difference between the legs of the MZI was not a problem. The source plane location of the apparatus in FIG. 2 was located at L3 266 (a 1500 mm lens). L3 266 produced the far-zone irradiance pattern of the field which was subsequently recorded by a Lumenera Lw135RM camera 270 [48] placed at the focus of L3 266. This part of the apparatus was used to validate the design.

Figure 3:
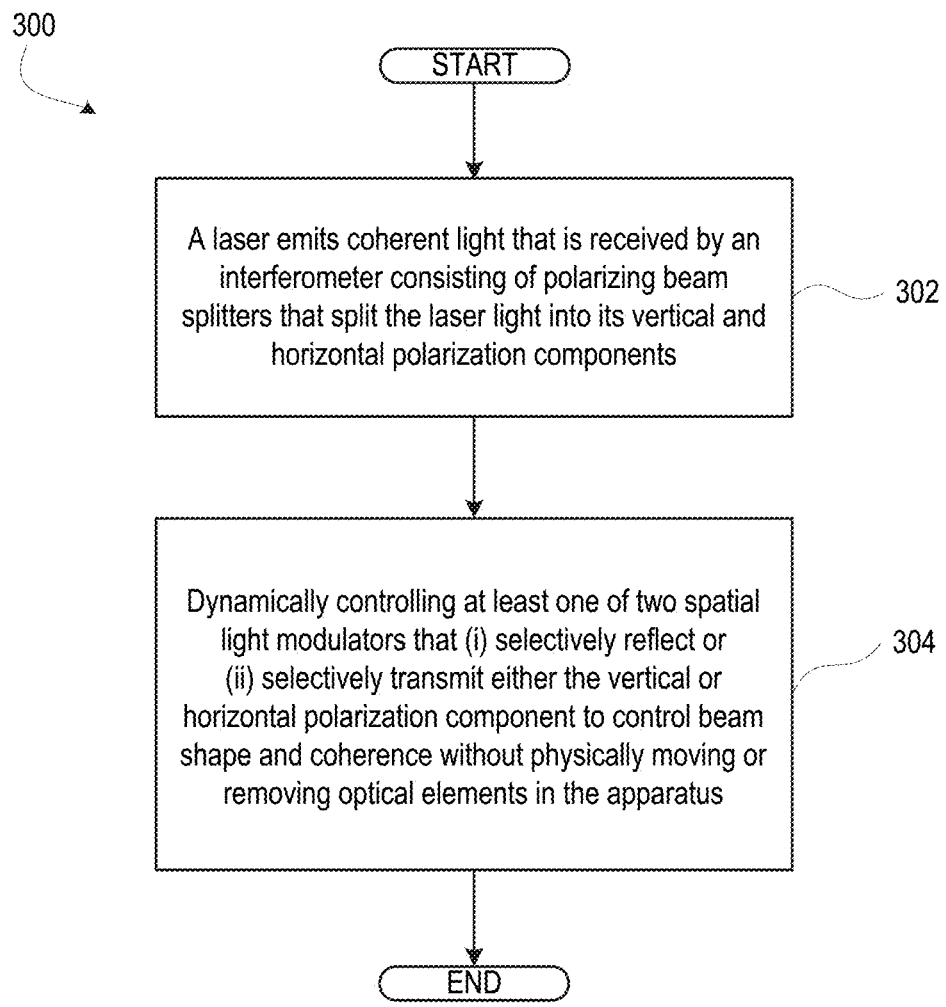
FIG. 3 is a flow diagram of a method for dynamically controlling beam shape and coherence of a VPCS using SLMs, according to one or more embodiments.

FIG. 3 illustrates a method 300 for adjusting beam shape and coherence of a VPCS without having to reconfigure the physical set-up. Method 300 includes a laser that emits coherent light that is received by an interferometer consisting of PBSs that split the laser light into its vertical and horizontal polarization components (block 302). Method 300 includes dynamically controlling at least one of two SLMs that (i) selectively reflect or selectively transmit either the vertical or horizontal polarization component to control beam shape and coherence without physically moving or removing optical elements in the apparatus (block 304). Method 300 then ends.

In one or more embodiments, method 300 further includes dynamically controlling at least one of two SLMs that each comprise LC reflective SLMs.

In one or more embodiments, method 300 further includes dynamically controlling at least one of two SLMs to produce a Schell-model source.

In one or more embodiments, method 300 further includes dynamically controlling at least one of two SLMs to produce a non-Schell-model source.

In one or more embodiments, method 300 further includes dynamically controlling at least one of two SLMs that each comprise LC transmissive SLMs.

In one or more embodiments, method 300 further includes dynamically controlling at least one of two SLMs that each comprise segmented deformable mirrors.

In one or more embodiments, method 300 further includes dynamically controlling at least one of two SLMs that each comprise digital micro-mirror devices.

In one or more embodiments, method 300 further includes a MZI.

Underlying theory: A VPCS is completely described by the elements of its CSD matrix:

$$W(\rho_1, \rho_2, \omega) = \begin{bmatrix} W_{xx}(\rho_1, \rho_2, \omega) & W_{xy}(\rho_1, \rho_2, \omega) \\ W_{yx}(\rho_1, \rho_2, \omega) & W_{yy}(\rho_1, \rho_2, \omega) \end{bmatrix} = \begin{bmatrix} \langle E_x(\rho_1, \omega) E_x^*(\rho_2, \omega) \rangle & \langle E_x(\rho_1, \omega) E_y^*(\rho_2, \omega) \rangle \\ \langle E_y(\rho_1, \omega) E_x^*(\rho_2, \omega) \rangle & \langle E_y(\rho_1, \omega) E_y^*(\rho_2, \omega) \rangle \end{bmatrix}, \quad \text{Eqn. (1)}$$

where $E_i$ is the $i^{th}$ component of the electric field, $W_{ij}$ is the CSD function of the $i^{th}$ and $j^{th}$ field components, $\rho = \hat{x}x + \hat{y}y$, and $\omega$ is the radian frequency [2, 5]. Note that in expressing W as a function of a single frequency $\omega$, it has been assumed that the random optical field is wide-sense stationary. Hereafter, the dependence of the CSD matrix, CSD functions, and optical fields on $\omega$ is suppressed.

In this work, $W_{ij}$ of the form $$W_{ij}(\rho_1, \rho_2) = \sqrt{S_i(\rho_1)} \sqrt{S_j(\rho_2)} \mu_{ij}(\rho_1, \rho_2) \quad \text{Eqn. (2)}$$

are germane. In Eqn. (2), $S_i$ is the spectral density of the $i^{th}$ field component and $\mu_{ij}$ is the cross-correlation function of the $i^{th}$ and $j^{th}$ components. It is required that $\mu_{ij} = \mu_{ji}^*$ [2, 5]. If $\mu_{ij}$ can be expressed solely as a function of $\rho_1 - \rho_2$, then $W_{ij}$ in Eqn. (2) takes the Schell-model form [2, 5, 44, 45]. To demonstrate the flexibility of the apparatus in FIG. 1, both a non-Schell-model and Schell-model source are generated (as described below). For now, the analysis continues with the general CSD function given in Eqn. (2).

MPS Technique: An instance of an MPS field takes the form [46]

$$E^{MPS}(\Sigma) = \hat{x}\sqrt{S_x(\rho)}\exp(j\{arg[T_x(\rho)] + \alpha_x\}),$$
$$+ \hat{y}\sqrt{S_y(\rho)}\exp(j\{arg[T_y(\rho)] + \alpha_y\}) \quad \text{Eqn. (3)}$$

where $j = \sqrt{-1}$, $\alpha_i$ is the phase of the $i^{th}$ field component, and $T_i$ is the complex transmit-tance screen for the $i^{th}$ component [49-51]. Taking the vector autocorrelation of Eqn. (3) yields $$W_{ij}^{MPS}(\rho_1, \rho_2) = \quad \text{Eqn. (4)}$$
$$\langle E_i^{MPS}(\rho_1) E_j^{MPS*}(\rho_2) \rangle = \sqrt{S_i(\rho_1)} \sqrt{S_j(\rho_2)} \exp[j(\alpha_i - \alpha_j)]$$
$$\langle \exp\{j \arg[T_i(\rho_1)]\}\exp\{-j \arg[T_j(\rho_2)]\}\rangle =$$
$$\sqrt{S_i(\rho_1)} \sqrt{S_j(\rho_2)} \chi_{ij}(\rho_1, \rho_2).$$

Comparing Eqn. (4) to Eqn. (2) reveals the following desired condition $$\chi_{ij}(\rho_1, \rho_2) = \mu_{ij}(\rho_1, \rho_2), \quad \text{Eqn. (5)}$$

which, in general, is never satisfied. However, it can be shown, by numerically computing $\chi_{ij}$ using the joint probability density function of speckle phases [52], that $\chi_{ij} \approx \mu_{ij}$ such that the MPS partially coherent source is practically indistinguishable from the true source. This analysis is presented in [53] and not reproduced here for the sake of brevity. Methods to synthesize $T_x$ and $T_y$ to produce the desired $\mu_{xx}$, $\mu_{yy}$, and $\mu_{xy}$ are presented next.

Screen Synthesis-Non-Schell-Model Source: It is now convenient to assume forms for $S_i$ and $\mu_{ij}$. An example of a vector non-Schell-model source is an ENUC beam [5, 54]. Its CSD matrix elements take the form $$W_{ij}(\rho_1, \rho_2) = A_i \exp\left(-\frac{\rho_1^2}{4\sigma_i^2}\right) A_j \exp\left(-\frac{\rho_2^2}{4\sigma_j^2}\right) \times \quad \text{Eqn. (6)}$$
$$B_{ij} \exp\left\{-\frac{[(\rho_1 - \gamma_i)^2 - (\rho_2 - \gamma_j)^2]}{\delta_{ij}^4}\right\},$$

where $A_i$ and $\sigma_i$ are the amplitude and r.m.s. width of the $i_{th}$ field component, respectively. Also in Eqn. (6), $\delta_{ij}$ is the cross-correlation width, $B_{ij}$ is the complex cross-correlation coef-ficient, and $\gamma_i$ is a real, two-dimensional vector that shifts the maximum of the correlation function away from the origin. Note that $\delta_{ij} = \delta_{ji}$, $B_{ij} = B_{ji}^*$, $B_{ii} = B_{jj} = 1$, and $|B_{ij}| \leq 1$. In addition to these requirements, the ENUC source must also satisfy the realizability conditions given in [5, 54].

Synthesizing screens that will produce a desired ENUC source can be accomplished using the Cholesky factorization approach [55, 56]. Assuming an $N_y \times N_x$ computational grid, an instance of $T_i$ is created by $$T_i = R_i \frac{r_i}{\sqrt{2}}, \quad \text{Eqn. (7)}$$

where $r_i$ is an $(N_y N_x) \times 1$ vector of zero-mean, unit-variance, circular complex Gaussian random numbers and $T_i$ is the $(N_y N_x) \times 1$ complex screen. Lastly, $R_i$ is an $(N_y N_x) \times (N_y N_x)$ lower triangular matrix formed from the Cholesky decomposition of $\mu_{ii}$, namely, $$\mu_{ii} = R_i^T R_i, \quad \text{Eqn. (8)}$$

where $\mu_{ii}$ is the $(N_y N_x) \times (N_y N_x)$ matrix created by evaluating $\mu_{ii}$ [exponential on the second line of Eqn. (6)] at all combinations of points $(x_1, y_1)$ and $(z_2, y_2)$ making up the discrete grid.

Generating $T_x$ and $T_y$ using Eqn. (7) will produce an ENUC source with the desired $\mu_{xx}$ and $\mu_{yy}$. The statistical relationship between $T_x$ and $T_y$, in particular, the cross-correlation of $T_x$ and $T_y$, determines $\mu_{xy}$:

$$\langle T_x T_y^\dagger \rangle = \left\langle R_x \frac{r_x}{\sqrt{2}} \left( R_y \frac{r_y}{\sqrt{2}} \right)^\dagger \right\rangle = \frac{1}{2} R_x R_y^T \langle r_x r_y^\dagger \rangle, \quad \text{Eqn. (9)}$$

where † is the Hermitian transpose. The moment $\langle r_x r_y^\dagger \rangle = 2|B_{xy}|$ simplifying Eqn. (9) to $$\langle T_x T_y^\dagger \rangle = |B_{xy}| R_x R_y^\dagger. \quad \text{Eqn. (10)}$$

The right hand side of Eqn. (10) should equal the Cholesky factorization of $|\mu_{xy}|$. In general, it does not; however, there are two cases where it does:

1. If $B_{xy}=0$, $\delta_{xy}$ is irrelevant, $T_x$ and $T_y$ are statistically independent, and one is free to choose $\delta_{xx}$ and $\delta_{yy}$.
2. If $B_{xy} \neq 0$, then $\delta_{xx} = \delta_{yy} = \delta_{xy}$, and $\gamma_x = \gamma_y$.

Using the Cholesky factorization approach outlined above, any VPCS can be produced. Unfortunately, this flexibility comes at great cost. Computing Cholesky factors is very computationally intensive—the number of operations is O (n³) [56]. In addition, the matrix $\mu_{ii}$ is typically very large requiring a great deal of computer memory to store. For example, synthesizing a screen for a 512×512 SLM (the same size as the SLMs used in FIG. 2) requires a staggering 262, 144×262, 144 $\mu_{ii}$. To produce $T_x$ and $T_y$ for the ENUC experiments (results are presented below), $\mu_{xx}$ and $\mu_{yy}$ were calculated on 128×128 downsampled versions of the horizontal and vertical leg SLMs. From these, $R_x$ and $R_y$ were computed. The screens were then synthesized using Eqn. (7), reshaped, and then interpolated to 512×512.

Screen Synthesis—Schell-Model Source: The Cholesky factorization approach discussed in the previous section can be used to synthesize screens to produce any type of partially coherent source; however, the approach is very computationally intensive. If the partially coherent beam is a Schell-model source, then a simpler and more computationally efficient technique can be used to synthesize $T_x$ and $T_y$.

An example of a vector Schell-model source is an EMGSM beam [5, 57]. The CSD matrix elements of an EMGSM source take the form [5, 57]

$$W_{ij}(\rho_1, \rho_2) = A_i \exp\left(-\frac{\rho_1^2}{4\sigma_i^2}\right) A_j \exp\left(-\frac{\rho_2^2}{4\sigma_j^2}\right) \times \frac{B_{ij}}{C_0} \sum_{m=1}^{M} \binom{M}{m} \frac{(-1)^{m-1}}{m} \exp\left[-\frac{|\rho_1 - \rho_2|^2}{2m\delta_{ij}^2}\right], \quad \text{Eqn. (11)}$$

where the normalization constant $C_0$ is $$C_0 = \sum_{m=1}^{M} \binom{M}{m} \frac{(-1)^{m-1}}{m}. \quad \text{Eqn. (12)}$$

The other symbols have been defined previously. The same requirements on $\delta_{ij}$ and $B_{ij}$ stipulated above apply to EMGSM sources as well. In addition, EMGSM sources must also satisfy the realizability conditions given in [5, 57].

Since an EMGSM beam is a Schell-model source, $T_x$ and $T_y$ can be generated using the Monte Carlo spectral method. This technique has been described in the literature many times [5, 49-51, 58, 59]; therefore, only the key relations are included here. An instance of $T_i$ can be synthesized by $$T_i[k, l] = \sum_{p,q} r_i[p, q] \sqrt{\frac{\Phi_{ii}[p, q]}{2L_x L_y}} \left( j \frac{2\pi}{N_x} pk \right) \exp\left( j \frac{2\pi}{N_y} ql \right), \quad \text{Eqn. (13)}$$

where k, l are the discrete spatial indices of the screen, p, q are the discrete spatial frequency indices, $L_x$ and $L_y$ are the width and height of the grid in meters, and $r_i$ is an $N_y \times N_x$ matrix of zero-mean, unit-variance, circular complex Gaussian random numbers. Lastly, $\Phi_{ii}$ is the spatial power spectrum of $T_i$ (the Fourier transform of $\mu_{ii}$), namely, $$\Phi_{ii}(f) = \frac{2\pi\delta_{ii}^2}{C_0} \sum_{m=1}^{M} \binom{M}{m} (-1)^{m-1} \exp(-2m\pi^2 \delta_{ii}^2 f^2), \quad \text{Eqn. (14)}$$

where $f = \hat{x} f_x + \hat{y} f_y$ is the spatial frequency vector. Equation Eqn. (13) is in the form of a discrete inverse Fourier transform; thus, $T_i$ can be synthesized using the fast Fourier transform (FFT) algorithm.

Synthesizing $T_x$ and $T_y$ using Eqn. (13) will produce an EMGSM source with the desired $\mu_{xx}$ and $\mu_{yy}$. To determine the form of $\mu_{xy}$, one must take the cross-correlation of Eqn. (13), viz., $$\langle T_x[k_1, l_1] T_y^*[k_2, l_2] \rangle = \quad \text{Eqn. (15)}$$

$$\sum_{p_1, q_1} \sum_{p_2, q_2} \frac{\langle r_x[p_1, q_1] r_y^*[p_2, q_2] \rangle}{2L_x L_y} \sqrt{\Phi_{xx}[p_1, q_1] \Phi_{yy}[p_2, q_2]} \times$$

$$\exp\left[ j \frac{2\pi}{N_x} (p_1 k_1 - p_2 k_2) \right] \exp\left[ j \frac{2\pi}{N_y} (q_1 l_1 - q_2 l_2) \right].$$

The moment in Eqn. (15) evaluates to $2|B_{xy}|\delta[p_1-p_2]\delta[q_1-q_2]$, where $\delta$ is the discrete Dirac delta function. Simplifying Eqn. (15) further yields $$\langle T_x[k_1, l_1] T_y^*[k_2, l_2] \rangle = \sum_{p,q} \frac{|B_{xy}|}{L_x L_y} \sqrt{\Phi_{xx}[p, q] \Phi_{yy}[p, q]} \times \quad \text{Eqn. (16)}$$

$$\exp\left[ j \frac{2\pi}{N_x} (k_1 - k_2) p \right] \exp\left[ j \frac{2\pi}{N_y} (l_1 - l_2) q \right].$$

The expression $|B_{xy}|\sqrt{\Phi_{xx}\Phi_{yy}}$ should equal the cross-power spectrum, namely, $$\Phi_{xy}(f) = |B_{xy}| \frac{2\pi\delta_{xy}^2}{C_0} \sum_{m=1}^{M} \binom{M}{m} (-1)^{m-1} \exp(-2m\pi^2 \delta_{xy}^2 f^2). \quad \text{Eqn. (17)}$$

Like the ENUC source discussed above, $|B_{xy}|\sqrt{\Phi_{xx}\Phi_{yy}} = \Phi_{xy}$ if (1) $B_{xy}=0$ or (2) $B_{xy} \neq 0$, then, $\delta_{xx} = \delta_{yy} = \delta_{xy}$.

Following the above analysis, any vector Schell-model source can be produced. Depending on the forms of $\mu_{xx}$, $\mu_{yy}$, and $\mu_{xy}$, one may have more freedom in choosing $B_{xy}$, $\delta_{xx}$, $\delta_{yy}$, and $\delta_{xy}$ than in the EMGSM case above. Two examples of sources where this is the case are EGSM [50] and EGSM vortex beams [32].

Phase-Only MPS Field: Recall that in the apparatus in FIG. 1, all phasing and amplitude control is accomplished using phase-only SLMs. In the preceding sections, two methods for synthesizing $T_x$ and $T_y$ to produce partially coherent sources with the desired $\mu_{xx}$, $\mu_{yy}$, and $\mu_{xy}$ were discussed. This analysis handled the MPS field component phases that are ultimately commanded to the horizontal and vertical leg SLMs. What remains is a discussion of how the MPS field component amplitudes, namely, $\sqrt{S_x}$ and $\sqrt{S_y}$, are handled.

Amplitude can be controlled using a phase-only SLM by creating a sawtooth phase grating which produces the desired field in the first diffraction order. By manipulating the height of the grating, the field's amplitude can be precisely controlled. The expression relating sawtooth height to the field in the first diffraction order has been derived previously [51, 60, 61]:

$$U(\rho) \approx \text{sinc}\{\pi[1-h(\rho)]\}\exp\{-j\pi[1-h(\rho)]\} = H(h)\exp[-jP(h)], \quad \text{Eqn. (18)}$$

where h is the height of sawtooth in waves and sinc (x)=sin (x)/x. Assumed in this relation is that more than four SLM pixels comprise each sawtooth.

The vertical and horizontal leg phases commanded to the SLMs are $$\theta_V[k,l] = \arg(\exp\{j[G(h_y) + \arg(T_y) + F(h_y) + \alpha_y]\}),$$

$$\theta_H[k,l] = \arg(\exp\{j[G(h_x) + \arg(T_x) + F(h_x) + \alpha_x]\}) \quad \text{Eqn. (19)}$$

where $h_x$ and $h_y$ are found by solving $$h_i = H^{-1}\left(\sqrt{\frac{S_i}{\max\{S_i, S_j\}}}\right), \quad \text{Eqn. (20)}$$

G is the function that forms the two-dimensional sawtooth phase grating, and F is the function that creates two-dimensional P. The purpose of F is to remove the "phase aberration" caused by G. Note that $\exp[j(\alpha_x - \alpha_y)] = \exp[j \arg(B_{xy})]$. The desired x and y components of the MPS field are produced in the horizontal and vertical legs' first diffraction orders, respectively.

It should be noted that in general, the heights of the sawteeth making up the SLM gratings vary spatially; however, all the sawteeth contain the same number of SLM pixels. The SLM gratings can be formed in any direction—horizontally, vertically, or diagonally.

FIGS. 4A-H illustrate the screen synthesis process for producing a single instance of the y (vertical) component $E_y$ of an EMGSM source. FIGS. 4A-B show the first step for producing a vertical leg phase screen. FIG. 4A is a two-dimensional graph 410 illustrating the spectral density $S_y$. FIG. 4B is a two-dimensional graph 420 illustrating the correlation function $\mu_{yy}$.

The sawtooth grating is determined by the spectral density. Thus, in step 2, FIG. 4C is a two-dimensional graph 430 illustrating the grating heights $h_y$ of Eqn. (20). In step 3, FIGS. 4D-E are two-dimensional graphs 440, 450 illustrating functions G and F that are grouped under $S_y$, FIG. 4A.

The phase of the screen is formed from the correlation function $\mu_{yy}$, FIG. 4B—in this case, via the power spectrum $\Phi_{yy}$. Hence, in step 4, FIG. 4F is a two-dimensional graph 460 of the spatial power spectrum $\Phi_{yy}$ of Eqn. (14). In step 5, FIG. 4G is a two-dimensional graph 470 of an instance of $T_y$ of Eqn. (13), which is grouped below $\mu_{yy}$, FIG. 4B.

Lastly, in step 6, FIG. 4H is a two-dimensional graph 480 of screen $\theta_V$ that is produced using Eqn. (19). The same process is used to produce an instance of $E_x$, i.e., synthesize the horizontal leg screen $\theta_H$.

Note that if $|B_{xy}| \neq 0$, then $T_x$ and $T_y$ must be synthesized from correlated $r_x$ and $r_y$ [see Eqn. (13)]. Since $r_x$ and $r_y$ are Gaussian, this is a relatively easy task. Most of the popular mathematical software packages have correlated Gaussian random number genera, tors. Correlated Gaussian random numbers can also be produced by linearly transforming independent sequences of Gaussian random numbers [62].

Experimental Procedure and Data Processing: An ENUC and EMGSM source were produced using the apparatus in FIG. 2 to demonstrate the flexibility and utility of the set-up. The measured irradiances, $I_x$ and $I_y$, from 5,000 ENUC and EMGSM fields were used to compute the normalized spectral densities $$\tilde{S}_i(\rho) = \frac{S_i(\rho)}{\max\{S_x(\rho) + S_y(\rho)\}} \quad \text{Eqn. (21)}$$

and correlations of irradiance $$\tilde{\Gamma}_{ii}(\rho_1, 0) = \frac{\Gamma_{ii}(\rho_1, 0)}{\max\{\Gamma_{ii}(\rho_1, 0)\}} \quad \text{Eqn. (22)}$$

$$\tilde{\Gamma}_{ij}(\rho_1, 0) = \frac{\Gamma_{ij}(\rho_1, 0)}{\sqrt{\max\{\Gamma_{xx}(\rho_1, 0)\Gamma_{yy}(\rho_1, 0)\}}},$$

where $\Gamma_{ij}(\rho_1, \rho_2) = \langle I_i(\rho_1) I_j(\rho_2)\rangle$. Each of the 5,000 $I_x$ and $I_y$ were flat fielded and registered before computing the above moments. The experimental $\tilde{S}_i$ and $\tilde{\Gamma}_{ij}$ were then compared to the corresponding theoretical expressions (discussed below) to validate the proposed approach. It should be noted that $I_x$ and $I_y$ were physically separated at the camera (not overlapped as shown in FIG. 2). This was done to make calculating the spectral densities and correlations of irradiance more convenient. The experimental ENUC and EMGSM source parameters are reported in TABLE 1.

TABLE 1

| VPCS Parameters | | |
|---|---|---|
| | ENUC | EMGSM |
| $A_x$ | 1 | 1.5 |
| $A_y$ | 1 | 1 |
| $B_{xy}$ | 0 | 0.5 |
| $\sigma_x$ (mm) | 1 | 0.4 |
| $\sigma_y$ (mm) | 1 | 0.8 |
| $\delta_{xx}$ (mm) | 0.7 | 0.6 |
| $\delta_{yy}$ (mm) | 0.6 | 0.6 |
| $\delta_{xy}$ (mm) | N/A | 0.6 |
| $\gamma_x$ (mm) | $\hat{x}$0.6 | N/A |
| $\gamma_y$ (mm) | $\hat{y}$0.7 | N/A |
| M | N/A | 10 |

FIG. 5A is a two-dimensional graph 510 of example $I_x$ for the ENUC source. FIG. 5B is a two-dimensional graph 520 of example $I_y$ for the ENUC source. FIG. 5C is a two-dimensional graph 530 of example $I_x$ for the EMGSM source. FIG. 5D is a two-dimensional graph 540 of example $I_y$ for the EMGSM source. The units are in digital counts.

ENUC sources exhibit self-focusing in the near field. The locations of the $\tilde{S}_i$ maxima are determined by $\gamma_i$ [5, 54]. Here, the $\tilde{S}_x$ and $\tilde{S}_y$ maxima occur off axis, shifted in the x and y directions, respectively (see TABLE 1). EMGSM sources produce far-zone $\tilde{S}_i$ with flat-topped profiles. The parameter M determines the flatness of $\tilde{S}_i$ [5, 57].

In the experiments, the horizontal and vertical leg SLM gratings had a period of eight SLM pixels per sawtooth and were applied in both the x and y directions (i.e., diagonally). The BNS SLMs used in the experiments have a fill factor of 83.4% [47]. The dead space between SLM pixels produces bright, sinc-like, far-zone patterns coinciding with the zeroth diffraction orders in the horizontal and vertical legs of the apparatus. Using diagonal gratings moved the desired first orders away from the zeroth orders' bright side lobes, thereby, minimizing corruption of the resulting fields.

The analytical expressions for the CSD matrix elements of an ENUC source corresponding to the experimental set-up are $$W_{ij}(\rho_1, \rho_2, z = f) = \frac{\exp\left[\frac{jk}{2f}(\rho_1^2 - \rho_2^2)\right]}{\lambda^2 f^2} \int\int\int\int_{-\infty}^{\infty} W_{ij}(\rho_1', \rho_2')$$

$$\exp\left[\frac{-jk}{2R}(\rho_1'^2 - \rho_2'^2)\right] \times \exp\left[\frac{-jk}{f}(\rho_1 \cdot \rho_1' - \rho_2 \cdot \rho_2')\right] d^2\rho_1' d^2\rho_2',$$

Eqn. (23)

where f=1.5 m, λ=632.8 nm, and $W_{ij}$ in the integrand is the ENUC CSD function given in Eqn. (6). The above integrals cannot be evaluated in closed form; however, they can be computed using the FFT algorithm.

As stated above, an interesting characteristic of ENUC sources is that they exhibit self-focusing in the near field [5, 54]. To demonstrate this in the experiments, a R=−3 m phase curvature was applied to the horizontal and vertical leg SLMs in addition to the ENUC phases given in Eqn. (19).

Unlike ENUC sources, the theoretical EMGSM CSD matrix elements observed at the focus of a lens are easily derived in closed form:

$$W_{ij}(\rho_1, \rho_2, z = f) =$$

Eqn. (24)

$$\frac{\exp\left[\frac{jk}{2f}(\rho_1^2 - \rho_2^2)\right]}{\lambda^2 f^2} \frac{A_i A_j B_{ij}}{C_0} \sum_{m=1}^{M} \frac{(-1)^{m-1}}{m}\binom{M}{m}$$

$$\frac{\pi^2}{a_{i,ij}a_{j,ij} - b_{ij}^2} \times \exp\left(-\frac{k}{4f^2}\frac{a_{j,ij}x_1^2 - 2b_{ij}x_1x_2 + a_{i,ij}x_2^2}{a_{i,ij}a_{j,ij} - b_{ij}^2}\right)$$

$$\exp\left(-\frac{k}{4f^2}\frac{a_{j,ij}y_1^2 - 2b_{ij}y_1y_2 + a_{i,ij}y_2^2}{a_{i,ij}a_{j,ij} - b_{ij}^2}\right),$$

where $a_{i,ij}=1/(4\sigma_i^2)+b_{ij}$, $a_{j,ij}=1/(4\sigma_j^2)+b_{ij}$, and $b_{ij}=1/(2m\delta_{ij}^2)$.

The spectral densities are easy to compute using Eqn. (23) and Eqn. (24), i.e., $S_i(\rho)=W_{ii}(\rho, \rho)$. Since the fields are Gaussian distributed, the theoretical correlations of irradiance can be expressed in terms of Eqn. (23) and Eqn. (24) by using the Gaussian moment theorem [6, 30, 41, 52]:

$$\Gamma_{ij}(\rho_1, \rho_2) = \langle I_i(\rho_1)I_j(\rho_2)\rangle = \langle E_i(\rho_1)E_i^*(\rho_1)E_j(\rho_2)E_j^*(\rho_2)\rangle$$

$$= \langle E_i(\rho_1)E_j^*(\rho_2)\rangle\langle E_i^*(\rho_1)E_j(\rho_2)\rangle +$$

$$\langle E_i(\rho_1)E_i^*(\rho_1)\rangle\langle E_j(\rho_2)E_j^*(\rho_2)\rangle$$

$$= |W_{ij}(\rho_1, \rho_2)|^2 + S_i(\rho_1)S_j(\rho_2).$$

Eqn. (25)

Validation: FIGS. 6A-F and FIGS. 7A-L illustrate the near-field normal-ized spectral density and correlation of irradiance results for the ENUC source, respectively. FIGS. 8A-F and FIGS. 9A-L show the corresponding far-field results for the EMGSM source. FIGS. 6A-C and FIGS. 8A-C illustrate A the theoretical $\tilde{S}_x^{thy}$, B the experimental $\tilde{S}_x^{exp}$, and C the y=0 slice of $\tilde{S}_x$ theory (solid blue trace) versus experiment (red circles), respectively. FIGS. 6D-F and FIGS. 8D-F show the same results for $\tilde{S}_y$ except for F which reports the x=0 slice.

The correlation of irradiance figures (FIGS. 7 and 9) are oriented in a similar manner to the spectral density results: A and D show the theoretical, B and E show the experimental, and C and F show the y=0 slices of the theoretical (solid blue trace) versus the experimental (red circles) $\tilde{\Gamma}_{xx}$ and $\tilde{\Gamma}_{xy}$ results, respectively. FIGS. 7G-L and FIGS. 9G-L show the same results for $\tilde{\Gamma}_{xx}$ and $\tilde{\Gamma}_{xy}$ except for I and L which report the x=0 slices.

Except for a few minor discrepancies, e.g., FIGS. 7F, 7L, and 8C, the agreement between the experimental and theoretical results is excellent. These results validate the proposed apparatus. It should be noted that EGSM vortex [32] and electromagnetic Bessel-Gaussian Schell-model beams [11] were also produced as part of this study. The results were similar to those for the ENUC and EMGSM sources; they are not presented here for the sake of brevity.

OPD Control: One parameter that has been difficult to control is arg ($B_{xy}$), which is required if one desires to generate elliptically polarized sources. Precise control of this term requires that the OPD between the horizontal and vertical legs of the apparatus be known and most importantly stable. The OPD between the legs can vary significantly due to slight variations in temperature or small vibrations.

Unfortunately, we have not been able to stabilize the OPD of the apparatus in FIG. 2. In our most recent attempt, we tried to actively correct the system OPD using a three-bin phase-shifting interferometer and a variable retarder operating in closed loop. The OPD drift was too fast to correct. Subsequent measurement of the OPD found that it varied randomly over 0.5 waves (roughly 300 nm) and faster than 120 Hz. Our inability to control arg ($B_{xy}$) is a limitation of our equipment and the not the proposed design.

Design Considerations: It is worth discussing some key aspects of the proposed device which must be considered when designing or building a system like that in FIG. 1 for a specific application. Two of these have been previously discussed—controlling the OPD between the horizontal and vertical legs of the MZI and the coherence length of the light source. In addition to these, the size D, pixel pitch Δ, and type of SLM also play an important role in the types of sources that can be generated.

SLM Size D: Clearly, sources with correlation or beam widths (δ and σ, respectively) greater than D cannot be accurately generated. Even sources with δ, σ≈D will have correlation functions μ or spectral densities S that are driven by the shape of the SLM's active area. Therefore, D sets the effective "coherent" and "maximum" source sizes. In practice, both S and μ should "fit" comfortably on the SLM face. An empirically-derived criterion which ensures this, is that both μ and √S should be no greater than 1% of their maximum values at the edges of the SLM.

SLM Pitch Δ: To adequately sample or represent μ requires Δ<δ/5, where δ, in this context, is the 1/e point or first zero crossing of μ (whichever is appropriate). Sources with correlation radii δ<5Δ will not be accurately produced, making 5Δ the effective "incoherent" limit of the SLM. Similarly, adequate sampling of S generally requires that Δ<σ/(5L), where σ is the 1/e point or first zero location of √S (whichever is appropriate) and L is the sawtooth grating period. This requirement is more stringent than the correlation condition because SLM pixels are binned to form the sawtooth grating (eight pixels were used here). Thus, the amplitude of the desired source is generally harder to produce than is the phase [46, 51]. The requirement that σ>5LΔ sets the effective "minimum" source size of the SLM.

The grating period L affects system performance in two competing ways. A large L better approximates a continuous sawtooth and results in more precise amplitude control. Recall that the expression relating sawtooth grating height to the field in the first diffraction order Eqn. (18) requires that L>4. L also affects the angular separation of the diffraction orders:

$$\sin\theta_m = \frac{m\lambda}{L\Delta}, \quad \text{Eqn. (26)}$$

where m is the order number [63]. Clearly, L and $\theta_m$ are inversely related. L must therefore be chosen so that the field's amplitude can be accurately produced, while also providing a large enough angular separation of the orders such that the desired first order can be passed by a spatial filter with little corruption from the m≠1 orders.

SLM Type: Many different types of SLMs exist [63]. The two most popular are LC SLMs (the type used here) and segmented deformable mirrors. Both have pros and cons which are briefly discussed here. LC SLMs generally possess a large number of small pixels—the current state-of-the-art is a 10 megapixel (4094×2464) SLM with a 3.74 μm pitch [64]. The sheer number and size of pixels in modern LC SLMs permits practically any partially coherent source to be generated. The major drawback of LC SLMs is speed with the fastest operating at about 1 KHz. Note that most LC SLMs operate well below 1 KHz; the 10 megapixel SLM mentioned previously operates at 24 Hz [64].

Segmented deformable mirrors, on the other hand, generally possess a much smaller number of much larger pixels/actuators. The current state-of-the-art in segmented deformable mirrors is a 4092 actuator (64×64) device with a 400 μm pitch [65]. When one considers the importance of SLM size and pitch in producing partially coherent sources, it is clear that segmented deformable mirrors cannot match the range of LC SLMs. Segmented deformable mirrors, however, are orders of magnitude faster than their LC counterparts, e.g., the 4092 actuator device mentioned previously operates at 10 KHz [65].

Choosing which type of SLM to employ in the apparatus in FIG. 1 comes down to the importance of speed. If speed is of lesser importance than range/flexibility in the application, LC SLMs are the best choice. If, on the other hand, speed is paramount, segmented deformable mirrors are the better option.

Design Optimization: What makes the apparatus in FIG. 1 very powerful is the ability to generate many different types of VPCSs using phase-only SLMs and a simple optical set-up. The range of sources that can be produced is much greater than existing systems which use separate optical components to manipulate beam shape and coherence. The most significant drawback of the proposed approach over existing partially coherent source generators, particularly, those which use rotating ground glass diffusers and amplitude filters, is speed. As stated above, if speed is paramount, segmented deformable mirrors can be used instead of LC SLMs at the expense of flexibility.

It should be noted that the apparatus in FIG. 2 was built for proof-of-concept purposes only, with no particular application in mind. Thus, the total size of the system (its footprint) has not been optimized. The largest components (in terms of physical size) in FIG. 2 are the 4-fl spatial filters. Long-focal-length plano-convex lenses were used here solely for ease of set-up, alignment (i.e., minimize aberrations), and cost. By changing the layout of the system and employing standard optical design techniques [66, 67], the entire apparatus could be made to fit within a 1 m area.

The following references are incorporated by reference herein:

[1] E. Wolf, "Unified theory of coherence and polarization of random electromagnetic beams," Phys. Lett. A 312, 263-267 (2003).

[2] E. Wolf, *Introduction to the Theory of Coherence and Polarization of Light* (Cambridge University, 2007).

[3] F. Gori, M. Santarsiero, S. Vicalvi, R. Borghi, and G. Guattari, "Beam coherence-polarization matrix," Pure Appl. Opt. 7, 941-951 (1998).

[4] G. Gbur and T. D. Visser, "The structure of partially coherent fields," Prog. Opt. 55, 285-341 (2010).

[5] O. Korotkova, *Random Light Beams: Theory and Applications* (CRC, 2014).

[6] Q. Zhan, ed., *Vectorial Optical Fields: Fundamentals and Applications* (World Scientific, 2014).

[7] M. Yao, I. Toselli, and O. Korotkova, "Propagation of electromagnetic stochastic beams in anisotropic turbulence," Opt. Express 22, 31608-31619 (2014).

[8] G. Gbur, "Partially coherent beam propagation in atmospheric turbulence," J. Opt. Soc. Am. A 31, 2038-2045 (2014).

[9] M. Salem, O. Korotkova, A. Dogariu, and E. Wolf "Polarization changes in partially coherent electromagnetic beams propagating through turbulent atmosphere," Waves Random Media 14, 513-523 (2004).

[10] S. Avramov-Zamurovic, C. Nelson, R. Malek-Madani, and O. Korotkova, "Polarization-induced reduction in scintillation of optical beams propagating in simulated turbulent atmospheric channels," Waves Random Complex Media 24, 452-462(2014).

[11] S. Avramov-Zamurovic, C. Nelson, S. Guth, O. Korotkova, and R. Malek-Madani, "Ex-perimental "Experimental study of electromagnetic Bessel-Gaussian Schell model beams propagating in a turbulent channel," Opt. Commun. 359, 207-215 (2016).

[12] C. Nelson, S. Avramov-Zamurovic, O. Korotkova, S. Guth, and R. Malek-Madani, "Scintillation reduction in pseudo multi-Gaussian Schell model beams in the maritime environment," Opt. Commun. 364, 145-149 (2016).

[13] F. Wang, X. Liu, and Y. Cai, "Propagation of partially coherent beam in turbulent atmosphere: a review," Prog. Electromagn. Res. 150, 123-143 (2015).

[14] O. Korotkova and N. Farwell, "Effect of oceanic turbulence on polarization of stochastic beams," Opt. Commun. 284, 1740-1746 (2011).

[15] O. Korotkova, L. C. Andrews, and R. L. Phillips, "Model for a partially coherent Gaussian beam in atmospheric turbulence with application in lasercom," Opt. Eng. 43, 330-341 (2004).

[16] K. Drexler, M. Roggemann, and D. Voelz, "Use of a partially coherent transmitter beam to improve the statistics of received power in a free-space optical communication system: theory and experimental results," Opt. Eng. 50, 025002 (2011).

[17] S. Sahin, Z. Tong, and O. Korotkova, "Sensing of semi-rough targets embedded in atmospheric turbulence by means of stochastic electromagnetic beams," Opt. Commun. 283, 4512-4518 (2010).

[18] Y. Cai, O. Korotkova, H. T. Eyyuboglu, and Y. Baykal, "Active laser radar systems with stochastic electromagnetic beams in turbulent atmosphere," Opt. Express 16, 15834-15846 (2008).

[19] J. Liu, L. Bi, P. Yang, and G. W. Kattawar, "Scattering of partially coherent electromagnetic beams by water droplets and ice crystals," J. Quant. Spectrosc. Radiat. Transfer 134, 74-84 (2014).

[20] Y. Zhang and D. Zhao, "The coherence and polarization properties of electromagnetic rectangular Gaussian Schell-model sources scattered by a deterministic medium," J. Opt. 16, 125709 (2014).

[21] T. van Dijk, D. G. Fischer, T. D. Visser, and E. Wolf, "Effects of spatial coherence on the angular distribution of radiant intensity generated by scattering ona sphere," Phys. Rev. Lett. 104, 173902 (2010).

[22] F. J. Torcal-Milla and L. M. Sanchez-Brea, "Gaussian-Schell-model beams propagating through rough gratings," J. Opt. Soc. Am. A 28, 308-313 (2011).

[23] D. G. Fischer, T. van Dijk, T. D. Visser, and E. Wolf "Coherence effects in Mie scattering," J. Opt. Soc. Am. A 29, 78-84 (2012).

[24] M. W. Hyde IV, "Physical optics solution for the scattering of a partially coherent wave from a circular cylinder," Opt. Commun. 338, 233-239 (2015).

[25] M. W. Hyde, A. E. Bogle, and M. J. Havrilla, "Scattering of a partially-coherent wave from a material circular cylinder," Opt. Express 21, 32327-32339 (2013).

[26] Y. Wang, S. Yan, D. Kuebel, and T. D. Visser, "Dynamic control of light scattering using spatial coherence," Phys. Rev. A 92, 013806 (2015).

[27] Y. Wang, H. F. Schouten, and T. D. Visser, "Tunable, anomalous Mie scattering using spatial coherence," Opt. Lett. 40, 4779-4782 (2015).

[28] Z. Mei and O. Korotkova, "Random light scattering by collections of ellipsoids," Opt. Express 20, 29296-29307 (2012).

[29] Y. Zhang and D. Zhao, "Scattering of multi-Gaussian Schell-model beams on a random medium," Opt. Express 21, 24781-24792 (2013).

[30] Y. Chen, F. Wang, L. Liu, C. Zhao, Y. Cai, and O. Korotkova, "Generation and propagation of a partially coherent vector beam with special correlation functions," Phys. Rev. A 89, 013801 (2014).

[31] F. Wang, Y. Cai, Y. Dong, and O. Korotkova, "Experimental generation of a radially polarized beam with controllable spatial coherence," Appl. Phys. Lett. 100, 051108 (2012).

[32] X. Liu, F. Wang, L. Liu, C. Zhao, and Y. Cai, "Generation and propagation of an electromagnetic Gaussian Schell-model vortex beam," J. Opt. Soc. Am. A 32, 2058-2065 (2015).

[33] Y. Chen, F. Wang, J. Yu, L. Liu, and Y. Cai, "Vector Hermite-Gaussian correlated Schell-model beam," Opt. Express 24, 15232-15250 (2016).

[34] T. Shirai, O. Korotkova, and E. Wolf "A method of generating electromagnetic Gaussian Schell-model beams," J. Opt. A: Pure Appl. Opt. 7, 232-237 (2005).

[35] M. Santarsiero, R. Borghi, and V. Ramírez-Sánchez, "Synthesis of electromagnetic Schell-model sources," J. Opt. Soc. Am. A 26, 1437-1443 (2009).

[36] G. Piquero, F. Gori, P. Romanini, M. Santarsiero, R. Borghi, and A. Mondello, "Synthesis of partially polarized Gaussian Schell-model sources," Opt. Commun. 208, 9-16 (2002).

[37] A. S. Ostrovsky, G. Rodríguez-Zurita, C. Meneses-Fabián, M. A. Olvera-Santamaría, and C. Rickenstorff-Parrao, "Experimental generating the partially coherent and partially polarized electromagnetic source," Opt. Express 18, 12864-12871 (2010).

[38] A. S. Ostrovsky, M. A. Olvera, C. Rickenstorf, G. Martínez-Niconoff, and V. Arrizón, "Generation of a secondary electromagnetic source with desired statistical properties," Opt. Commun. 283, 4490-4493 (2010).

[39] I. Vidal, E. Fonseca, and J. M. Hickmann, "Light polarization control during free-space propagation using coherence," Phys. Rev. A 84, 033836 (2011).

[40] P. De Santis, F. Gori, G. Guattari, and C. Palma, "An example of a Collett-Wolf source," Opt. Commun. 29, 256-260 (1979).

[41] Y. Cai, Y. Chen, and F. Wang, "Generation and propagation of partially coherent beams with nonconventional correlation functions: a review," J. Opt. Soc. Am. A 31, 2083-2096 (2014).

[42] T. Shirai and E. Wolf "Coherence and polarization of electromagnetic beams modulated by random phase screens and their changes on propagation in free space," J. Opt. Soc. Am. A 21, 1907-1916 (2004).

[43] A. S. Ostrovsky, G. Martínez-Niconoff V. Arrizón, P. Martínez-Vara, M. A. Olvera-Santamar'ia, and C. Rickenstorff-Parrao, "Modulation of coherence and polarization using liquid crystal spatial light modulators," Opt. Express 17, 5257-5264 (2009).

[44] L. Mandel and E. Wolf, *Optical Coherence and Quantum Optics* (Cambridge University, 1995).

[45] J. W. Goodman, *Statistical Optics* (Wiley, 2015), 2nd ed.

[46] M. W. Hyde IV, S. Basu, D. G. Voelz, and X. Xiao, "Generating partially coherent Schell-model sources using a modified phase screen approach," Opt. Eng. 54, (2015).

[47] Boulder Nonlinear Systems, Inc., *Spatial Light Modulators—XY Series*(Retrieved Jul. 6, 2016).

[48] Lumenera Corporation, *Lw130R and Lw135R Very Low Noise Research-Grade* 1.4 *Megapixel USB* 2.0 *Camera for Custom OEM Applications* (Retrieved Jul. 6, 2016).

[49] D. Voelz, X. Xiao, and O. Korotkova, "Numerical modeling of Schell-model beams with arbitrary far-field patterns," Opt. Lett. 40, 352-355 (2015).

[50] S. Basu, M. W. Hyde, X. Xiao, D. G. Voelz, and O. Korotkova, "Computational approaches for generating electromagnetic Gaussian Schell-model sources," Opt. Express 22, 31691-31707(2014).

[51] M. W. Hyde, S. Basu, D. G. Voelz, and X. Xiao, "Experimentally generating any desired partially coherent Schell-model source using phase-only control," J. Appl. Phys. 118, 093102 (2015).

[52] J. W. Goodman, *Speckle Phenomena in Optics: Theory and Applications* (Roberts & Company, 2007).

[53] M. W. Hyde IV, S. Basu, X. Xiao, and D. G. Voelz, "Producing any desired far-field mean irradiance pattern using a partially-coherent Schell-model source," J. Opt. 17, 055607 (2015).

[54] Z. Tong and O. Korotkova, "Electromagnetic nonuniformly correlated beams," J. Opt. Soc. Am. A 29, 2154-2158 (2012).

[55] M. C. Roggemann and B. M. Welsh, *Imaging Through Turbulence* (CRC, 1996).

[56] D. S. Watkins, *Fundamental of Matrix Computations* (Wiley, 2002), 2nd ed.

[57] Z. Mei, O. Korotkova, and E. Shchepakina, "Electromagnetic multi-Gaussian Schell-model beams," J. Opt. 15, 025705 (2013).

[58] C. A. Mack, "Generating random rough edges, surfaces, and volumes," Appl. Opt. 52, 1472-1480 (2013).

[59] X. Xiao and D. Voelz, "Wave optics simulation approach for partial spatially coherent beams," Opt. Express 14, 6986-6992 (2006).

[60] E. Bolduc, N. Bent, E. Santamato, E. Karimi, and R. W. Boyd, "Exact solution to simultaneous intensity and phase encryption with a single phase-only hologram," Opt. Lett. 38, 3546-3549 (2013).

[61] J. A. Davis, D. M. Cottrell, J. Campos, M. J. Yzuel, and I. Moreno, "Encoding amplitude information onto phase-only filters," Appl. Opt. 38, 5004-5013(1999).

[62] S. Kay, *Intuitive Probability and Random Processes using MATLAB®* Springer, 2006).

[63] J. W. Goodman, *Introduction to Fourier Optics* (Roberts & Company, 2005), 3rd ed.

[64] Holoeye Photonics AG, *SLM Spatial Light Modulators* (Retrieved Nov. 8, 2016).

[65] Boston Micromachines Corporation, *+K-DM Family Specification Sheet* (Retrieved Nov. 8, 2016).

[66] M. J. Kidger, *Fundamental Optical Design* (SPIE, 2001).

[67] M. J. Kidger, *Intermediate Optical Design* (SPIE, 2004).

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to one embodiment, an embodiment, embodiments, or one or more embodiments are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms a, an and the are intended to include the plural forms as well, unless the context clearly indicates otherwise. It will be further understood that the terms comprises and/or comprising, when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A vector partially coherent source (VPCS) generator comprising:
    a laser that emits coherent laser light;
    an interferometer consisting of polarizing beam splitters (PBSs) to split the laser light into vertical and horizontal polarization components;
    first and second spatial light modulators (SLMs) that respectively control the vertical and horizontal polarization components; and
    a control system communicatively coupled to the first and second SLMs to adjust beam shape and coherence without physically moving or removing optical elements in the interferometer.

2. The VPCS generator of claim 1, wherein the first and second SLMs comprise liquid crystal (LC) reflective SLMs.

3. The VPCS generator of claim 1, wherein the control system adjusts the at least one of the first and second SLMs to produce a Schell-model source.

4. The VPCS generator of claim 1, wherein the control system adjusts the at least one of the first and second SLMs to produce a non-Schell-model source.

5. The VPCS generator of claim 1, wherein the first and second SLMs comprise liquid crystal (LC) transmissive SLMs.

6. The VPCS generator of claim 1, wherein the first and second SLMs comprise segmented deformable mirrors.

7. The VPCS generator of claim 1, wherein the first and second SLMs comprise digital micro-mirror devices.

8. The VPCS generator of claim 1, wherein the interferometer is a Mach-Zehnder interferometer (MZI).

9. A method comprising:
enabling a laser that emits coherent laser light that is received by an interferometer consisting of polarizing beam splitters (PBSs) that split the laser light into vertical and horizontal polarization components; and
dynamically controlling at least one of two spatial light modulators (SLMs) that control respectively the vertical and horizontal polarization component to control beam shape and coherence without physically moving or removing optical elements in the interferometer.

10. The method of claim 9, further comprising dynamically controlling at least one of two SLMs that each comprise a liquid crystal (LC) reflective SLM.

11. The method of claim 9, further comprising dynamically controlling the at least one of two SLMs to produce a Schell-model source.

12. The method of claim 9, further comprising dynamically controlling the at least one of two SLMs to produce a non-Schell-model source.

13. The method of claim 9, further comprising dynamically controlling at least one of two SLMs that each comprise a liquid crystal (LC) transmissive SLM.

14. The method of claim 9, further comprising dynamically controlling the at least one of two SLMs that each comprise a segmented deformable mirrors mirror.

15. The method of claim 9, further comprising dynamically controlling the at least one of two SLMs that each comprise a digital micro-mirror devices device.

16. The method of claim 9, wherein the interferometer is a Mach-Zehnder interferometer (MZI).

17. A vector partially coherent source (VPCS) generator comprising: a laser that emits coherent light; a phase means for converting the coherent laser light into 45° polarized light; a means for splitting the 45° polarized light into its vertical and horizontal polarization components; first and second SLMs that respectively control the vertical and horizontal polarization components; and a control system communicatively coupled to the first and second SLMs to adjust beam shape and coherence without physically moving or removing optical elements in the VPCS generator.

* * * * *